US007821850B2

(12) United States Patent
Suzuki

(10) Patent No.: US 7,821,850 B2
(45) Date of Patent: Oct. 26, 2010

(54) SEMICONDUCTOR DIGITAL CIRCUIT, FIFO BUFFER CIRCUIT, AND DATA TRANSFERRING METHOD

(75) Inventor: Kazumasa Suzuki, Tokyo (JP)

(73) Assignee: NEC Corporation, Tokyo (JP)

( * ) Notice: Subject to any disclaimer, the term of this patent is extended or adjusted under 35 U.S.C. 154(b) by 267 days.

(21) Appl. No.: 12/090,207

(22) PCT Filed: Oct. 13, 2006

(86) PCT No.: PCT/JP2006/320448

§ 371 (c)(1),
(2), (4) Date: Apr. 14, 2008

(87) PCT Pub. No.: WO2007/043644

PCT Pub. Date: Apr. 19, 2007

(65) Prior Publication Data

US 2009/0278567 A1    Nov. 12, 2009

(30) Foreign Application Priority Data

Oct. 13, 2005    (JP)    ............................. 2005-298268

(51) Int. Cl.
*G11C 7/00*    (2006.01)
*G11C 7/10*    (2006.01)
(52) U.S. Cl. ............................. 365/189.11; 365/189.17; 326/80; 327/217
(58) Field of Classification Search .................. 326/63, 326/68, 80–83, 86–87; 327/333
See application file for complete search history.

(56) References Cited

U.S. PATENT DOCUMENTS

| 7,138,831 | B2 | 11/2006 | Tobita |
| 7,437,582 | B1 * | 10/2008 | Parlour ........................ 713/320 |
| 2006/0232316 | A1 * | 10/2006 | Nomura ...................... 327/291 |

FOREIGN PATENT DOCUMENTS

| JP | 2004-295819 | 10/2004 |
| JP | 2005-269536 | 9/2005 |
| WO | WO 2005/008777 | * 1/2005 |

* cited by examiner

*Primary Examiner*—Rexford N Barnie
*Assistant Examiner*—Jany Tran
(74) *Attorney, Agent, or Firm*—Young & Thompson

(57) ABSTRACT

A FIFO buffer circuit is provided which, in data transmission between two circuit areas having different combinations of a power supply voltage and an operation clock frequency, can perform voltage level and clock rate conversion at the same place and time. In an input side area are a plurality of data entry registers, a write entry management circuit and a full signal generating circuit. In an output side area are a read entry management circuit, an empty signal generating circuit and an output selector. On the boundary between the input and output sides are entry management flag circuits that manage the presence or absence of effective data in the respective data entries; and voltage level converting circuits that convert voltage levels of the outputs of the data entry registers to the voltage levels of the output side. In this way, the clock rate replacements and voltage level conversions are performed.

30 Claims, 23 Drawing Sheets

SEMICONDUCTOR DIGITAL CIRCUIT, FIFO BUFFER CIRCUIT, AND DATA TRANSFERRING METHOD

FIELD OF THE INVENTION

The present invention relates to a semiconductor digital circuit, FIFO buffer circuit, and data transferring method, and particularly to a FIFO (First In First Out) buffer circuit that performs data transfer between two circuit areas having different power supply voltages and operation clocks.

BACKGROUND OF THE INVENTION

In recent years, as the number of elements formed on one chip of a semiconductor integrated circuit increases, the rise in power consumption has become even a bigger issue. In order to solve this problem, methods in which a circuit area is defined for a circuit block that realizes each function, and then the operation clock is stopped or is decreased the frequency for each of the circuit area, and the power supply voltage is lowered for each of the circuit area so as to reduce power consumption during operation are proposed. In these methods, the power supply voltage and the operation clock frequency might be different for each circuit area.

In general, a FIFO buffer circuit is used to perform data transfer between areas having different operation clocks. For instance, there is a method in which a buffer is disposed across two operation clock areas, and the control circuit on the write side of the buffer is included in an input side area and the control circuit on the read side of the buffer is included in an output side area (refer to Patent Document 1).

The aforementioned buffer transfers data to the other area using a synchronous circuit that uses D-FF (D-Flip-Flop) circuits in two stages so that data transfer between the clocks of both the input side area and the output side area is performed accurately.

Various kinds of FIFO buffer circuits other than the one described have been developed, and data transfer between different operation clock areas is not unusual anymore.

Data transfer using a conventional FIFO buffer circuit is performed as shown in FIG. 25. The FIFO buffer circuit 7 performs data transfer between a logic area (A) 5 and a logic area (B) 6 operating at different operation clocks. Input data are written by giving the input data that should be transferred from the logic area (A) 5 to a data input 103 of the FIFO buffer circuit 7 and validating a write enable signal 102.

The FIFO buffer circuit 7 has a plurality of entries defined, and when all the entries have valid data written to them and are full, the FIFO buffer circuit 7 informs the logic area (A) 5 that the entries are full by returning a full signal 107 to the logic area (A) 5. When a piece of valid data is registered in the FIFO buffer circuit 7, it informs the logic area (B) 6 of the entry by invalidating an empty signal 106.

When a circuit in the logic area (B) 6 requests data by validating a read request signal 104, the data is obtained from a data output 105. Both an input side area clock 100 and an output side area clock 101 are supplied to the FIFO buffer circuit 7, which transmits data without any loss by switching the clock inside.

On the other hand, data transfer between areas operating at different power supply voltages is generally performed by a voltage level converting circuit. Data transfer between areas having different power supply voltages and operation clock frequencies can be achieved by having a FIFO buffer circuit and a voltage level converting circuit in series as shown in FIG. 26. In FIG. 26, the logic area (A) 5 has a power supply voltage of VDD1 and operates at an operation clock frequency of CLKI100 and the logic area (B) 6 has a power supply voltage of VDD2 and operates at an operation clock frequency of CLKO101.

When data transfer is performed between these areas, a FIFO buffer circuit 7' temporarily synchronizes the clock of the output side area to the clock of the input side area and a voltage level converting circuit 8 matches the voltage level to VDD2. Then data is sent to the logic area (B) 6. The voltage level converting circuit 8 matches the voltage levels of output data 105' and an empty signal 106' of the FIFO buffer circuit 7' to VDD2 and matches the voltage levels of the request signal 104 and the output side area clock 101 to VDD1.

In another method shown in FIG. 27, first the voltage level converting circuit 8 matches the voltage levels of the data input 103 and the write enable signal 102 from the logic area (A) 5, and the input side area clock 100 to VDD2 and then a FIFO buffer circuit 7' performs data transfer between the areas operating at different clocks. The voltage level of the full signal from the FIFO buffer circuit 7" is matched to VDD1 by the voltage level converting circuit 8.

In the cases of the circuit configurations shown in FIGS. 26 and 27 where data transfer between areas operating at different clock frequency is performed by the FIFO buffer circuit and then voltage conversion is performed by the voltage level converting circuit, a small circuit area such as an intermediate area 3 having the power supply voltage VDD1 and an operation clock 101', obtained by converting the voltage level of the output side area clock 101, or an intermediate area 3' having the power supply voltage VDD2 and an operation clock 100', obtained by converting the voltage level of the input side area clock 100, is necessary between the voltage level converting circuit and the FIFO buffer circuit.

[Patent Document 1]
Japanese Patent Kokai Publication No. JP-P2004-295819A (FIGS. 1 and 2)

The disclosure of Patent Document 1 is incorporated in the present document by reference thereto.

SUMMARY OF THE DISCLOSURE

Problems to be Solved by the Invention

In the conventional FIFO buffer circuit described above, when data are transferred from a first circuit area having a combination of a first clock frequency and a first power supply voltage to a second circuit area having a combination of a second clock frequency and a second power supply voltage, since the voltage level conversion and the clock rate conversion are performed in two separate steps, a circuit area having a combination of the first clock frequency and the second power supply voltage is necessary in the case where the voltage level is converted first and a circuit area having a combination of the first power supply voltage and the second clock frequency is necessary in the case where the clock rate is converted first, creating a problem that a small intermediate area having a different combination of the power supply voltage and the clock frequency from the combinations of the original two circuit areas has to be provided between the two circuit areas.

In the layout design of an LSI (Large Scale Integrated circuit), the power is normally supplied through a network of power supply wiring formed in a circuit area having the same power supply voltage and another power supply wiring is formed in a circuit area having a different power supply voltage. Meanwhile clock skew is reduced by supplying the clock through a clock tree formed in a circuit area operating under the same clock. In the conventional FIFO buffer circuit, however, it is difficult to define areas since positions of the two boundaries of the power supply and the clock are different. Because of the presence of the small intermediate area, it is difficult to design the layout of the circuits, counted for a problem.

Further, in the conventional FIFO buffer circuit, even when this small intermediate area is treated as a circuit area, the voltage level of the clock needs to be converted there. As a result, the clock skew will increase, giving another problem to the layout design.

It is an object of the present invention to solve the problems described above, and provide a semiconductor digital circuit, FIFO buffer circuit, and data transferring method that can perform a voltage level conversion and a clock rate conversion at the same time in data transmission between two circuit areas having different combinations of a power supply voltage and an operation clock frequency.

Means to Solve the Problems

In a first aspect of the present invention, there is provided a semiconductor digital circuit that performs data transfer between first and second circuit areas operating at different power supply voltages and different operation clocks. The semiconductor digital circuit is disposed on the boundary between the first and second circuit areas and includes circuit elements that perform interconversions between different signal voltage levels of the first and second circuit areas.

A semiconductor digital circuit according to a second aspect of the present invention performs data transfer between first and second circuit areas operating at different power supply voltages and different operation clocks. The circuit comprises: a plurality of data entry registers that hold data; entry management flag circuits that manage the presence or absence of effective data in each of the plurality of the data entry registers; a write entry management circuit that specifies an entry to which data are written out of the data entry registers; a read entry management circuit that specifies an entry from which data are read out of the data entry registers; an output selector that selects one of contents in the data entry registers according to an instruction from the read entry management circuit and outputs the selected content; and voltage level converting circuits that mutually convert signal voltage levels of each of the first and second circuit areas; and the voltage level converting circuits are respectively provided between outputs of the data entry registers and inputs of the output selector and inside the entry management flag circuits.

There is provided another semiconductor digital circuit according to a third aspect of the present invention. The circuit comprises an M number (where M is a positive integer) of data entry registers that hold N-bit data (where N is a positive integer); a write entry management circuit that specifies an entry to which data are written among the data entry registers; a read entry management circuit that specifies an entry from which data are read out of the data entry registers; an output selector that selects one of contents in the data entry registers according to an instruction from the read entry management circuit and outputs the selected content; entry management flag circuits for M entries that manage the presence or absence of effective data in each of the data entry registers; a full signal generating circuit that generates a full signal indicating that the data entry registers are full from respective outputs of the entry management flag circuit; an empty signal generating circuit that generates an empty signal indicating that there is no effective data in the data entry registers from each output of the entry management flag circuit; and voltage level converting circuits that mutually convert a signal voltage level; and the voltage level converting circuits are respectively provided between outputs of the data entry registers and inputs of the output selector and inside the entry management flag circuits.

In a fourth aspect of the present invention, there is provided a data transferring method used in a semiconductor digital circuit that performs data transfer between first and second circuit areas operating at different power supply voltages and different operation clocks. The data transferring method is performed within a semiconductor digital circuit, which is disposed on the boundary between the first and second circuit areas, and which performs data transfer and performs interconversions between different signal voltage levels of the first and second circuit areas.

A data transferring method according to a fifth aspect of the present invention is used in a semiconductor digital circuit that performs data transfer between first and second circuit areas operating at different power supply voltages and different operation clocks; the semiconductor digital circuit is constituted by a plurality of data entry registers that hold data, entry management flag circuits that manage the presence or absence of effective data in each of the plurality of the data entry registers, a write entry management circuit that specifies an entry to which data are written out of the data entry registers, a read entry management circuit that specifies an entry from which data are read out of the data entry registers, an output selector that selects one of contents in the data entry registers according to an instruction from the read entry management circuit and outputs the selected content, and voltage level converting circuits that mutually convert a respective signal voltage level of the first and second circuit areas; and the voltage level converting circuits are respectively provided between outputs of the data entry registers and inputs of the output selector and inside the entry management flag circuits.

In another data transferring method according to a sixth aspect of the present invention, the semiconductor digital circuit is constituted by an M number (where M is a positive integer) of data entry registers that hold N-bit data (where N is a positive integer), a write entry management circuit that specifies an entry to which data are written out of the data entry registers, a read entry management circuit that specifies an entry from which data are read out of the data entry registers, an output selector that selects one of contents in the data entry registers according to an instruction from the read entry management circuit and outputs the selected content, entry management flag circuits for M entries that manage the presence or absence of effective data in each of the data entry registers, a full signal generating circuit that generates a full signal indicating that the data entry registers are full from each output of the entry management flag circuit, an empty signal generating circuit that generates an empty signal indicating that there is no effective data in the data entry registers from each output of the entry management flag circuit, and voltage level converting circuits that mutually convert a signal voltage level; and the voltage level converting circuits are respectively provided between outputs of the data entry registers and inputs of the output selector and inside the entry management flag circuits.

In other words, the semiconductor digital circuit of the present invention makes it possible to transfer data between two circuit areas having different combinations of a power supply voltage and an operation clock frequency by providing voltage level converting circuits inside a FIFO buffer circuit that performs data transfer between two circuit areas operating at different power supply voltages and operation clocks.

Further, the semiconductor digital circuit of the present invention is characterized in that the voltage level converting circuits are respectively provided between outputs of the data entry registers and inputs of the output selector and inside the entry management flag circuits in the FIFO buffer circuit.

Further, the semiconductor digital circuit of the present invention is characterized in that, when the entry management flag circuits of the FIFO buffer circuit are constituted by asynchronous RS-Flip-Flop (RS-FF) circuits or synchronous RS-Flip-Flop circuits, the voltage level converting circuits are provided at two locations of loop in the RS-FF circuits.

Further, the semiconductor digital circuit is characterized in that, when the entry management flag circuits of the FIFO buffer circuit are constituted by asynchronous RS-Flip-Flop circuits comprised of two NOR circuits, the interconversions of the signal voltage levels are performed simultaneously by constituting the NOR circuits with CVSL (Cascade Voltage Switch Logic) circuits.

MERITORIOUS EFFECTS OF THE INVENTION

As described above, in the semiconductor digital circuit of the present invention, it is possible to provide the boundary between areas operating at different power supply voltages at the same place as the boundary between areas operating at different clocks since the voltage level converting circuits are built into the FIFO buffer circuit, which becomes the boundary between areas operating at different clocks. More specifically, the two kinds of boundaries can be perfectly matched by building the voltage level converting circuits wherein the entry management flag circuits which include the boundary between areas operating at different clocks.

Further, in the semiconductor digital circuit of the present invention, since it is possible to match the boundary between areas operating at different power supply voltages with the boundary between areas operating at different clocks, the area where a single clock tree is formed becomes the same as the area where a single power supply network is formed in the layout design of the integrated circuit, making the design easy.

In other words, in the semiconductor digital circuit of the present invention, a small intermediate area is not necessary since the boundary between areas operating at different power supply voltages and the boundary between areas operating at different clocks can be matched by building the voltage level converting circuits into asynchronous or synchronous RS-FF circuits that manage entries by operating at the both clocks and that become the operation clock boundary in the FIFO buffer circuit and positioning the boundary between the areas operating at different power supply voltages at the same place as the boundary between the areas operating at different clocks.

Further, in the semiconductor digital circuit of the present invention, since the small area having a combination of a power supply voltage and a clock frequency different from those of the two areas is not necessary, the power supply wiring network and clock tree can be defined in the same circuit area and the layout design can be done easily.

In the present invention, by having the configuration and the operation as described above, in data transmission between two circuit areas having different combinations of a power supply voltage and an operation clock frequency, a voltage level conversion and a clock rate conversion can be performed at the same place at the same time.

EXPLANATIONS OF SYMBOLS

Figure 1:
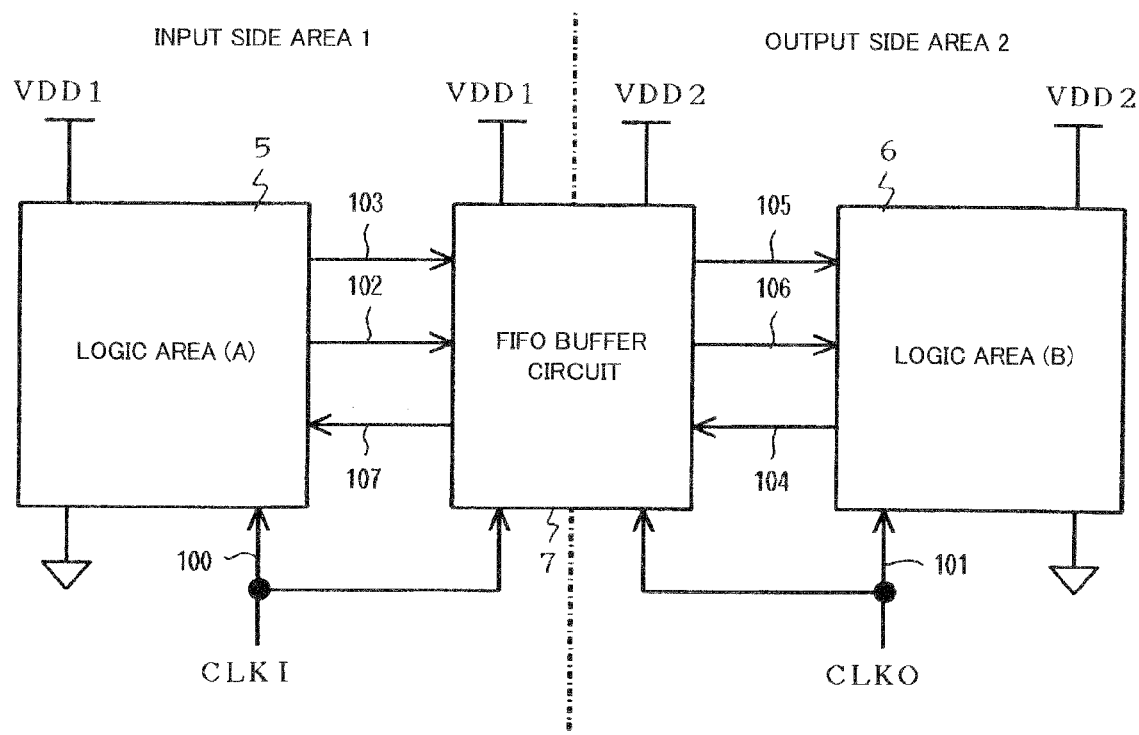
FIG. 1 is a block diagram showing the configuration of a semiconductor digital circuit according to a mode of the present invention.

1: input side area
2: output side area
5: logic area (A)
6: logic area (B)
7: FIFO buffer circuit
10: write entry management circuit
11a to 11d: data entry register
12a to 12d: entry management flag circuit
13: read entry management circuit
14: full signal generating circuit
15: empty signal generating circuit
16: output selector
17a to 17h: voltage level converting circuit
20: N-bit D-FF circuit
21: N-bit 4-input selector
22a to 22d: pulse generator
23a to 23c: asynchronous RS-FF circuit
24: synchronous RS-FF circuit
25: delay element
50a to 50h
53a to 53i: AND circuit
51a to 51b: NOR circuit
51': NOR circuit comprised of a CVSL circuit
52a to 52n: inverter circuit
54a to 54d: OR circuit
55: CVSL buffer/inverter circuit
56a to 56c: XOR circuit
57a: XNOR circuit
70a to 70i: D-FF circuit with an enable terminal
71a to 71r: D-FF circuit
90: pMOS transistor
91: nMOS transistor

PREFERRED MODES FOR CARRYING OUT THE INVENTION

Next, a mode of the present invention will be described with reference to the drawings. FIG. 1 is a block diagram showing the configuration of a semiconductor digital circuit according to a mode of the present invention. In the semiconductor digital circuit according to the mode of the present invention shown in FIG. 1, the need of the intermediate area between an input side area 1 and an output area 2 is eliminated by connecting a logic area (A) 5 having a power supply voltage of VDD1 and operating at an input side area clock 100 and a logic area (B) 6 having a power supply voltage of VDD2 and operating at an output side area clock 101 through a FIFO (First In First Out) buffer circuit 7.

Data from the logic area (A) 5 are registered in the FIFO buffer circuit 7 from a data input 103 by a write enable signal 102. The FIFO buffer circuit 7 has a plurality of entries that hold data and data can be registered successively several times. Once all the entries of the FIFO buffer circuit 7 are full of valid data, it informs the logic area (A) 5 that all the entries are full of valid data by validating a full signal 107.

Meanwhile, when valid data are registered in the FIFO buffer circuit 7 from the logic area (A) 5 on the input side, the logic area (B) is notified that the valid data have been registered by the fact that an empty signal 106 is invalidated. After this signal has been received and a read request signal 104 has been validated, the data are obtained from a data output 105 of the FIFO buffer circuit 7. By this operation, data can be transferred between the two circuit areas without losing any data.

Figure 2:
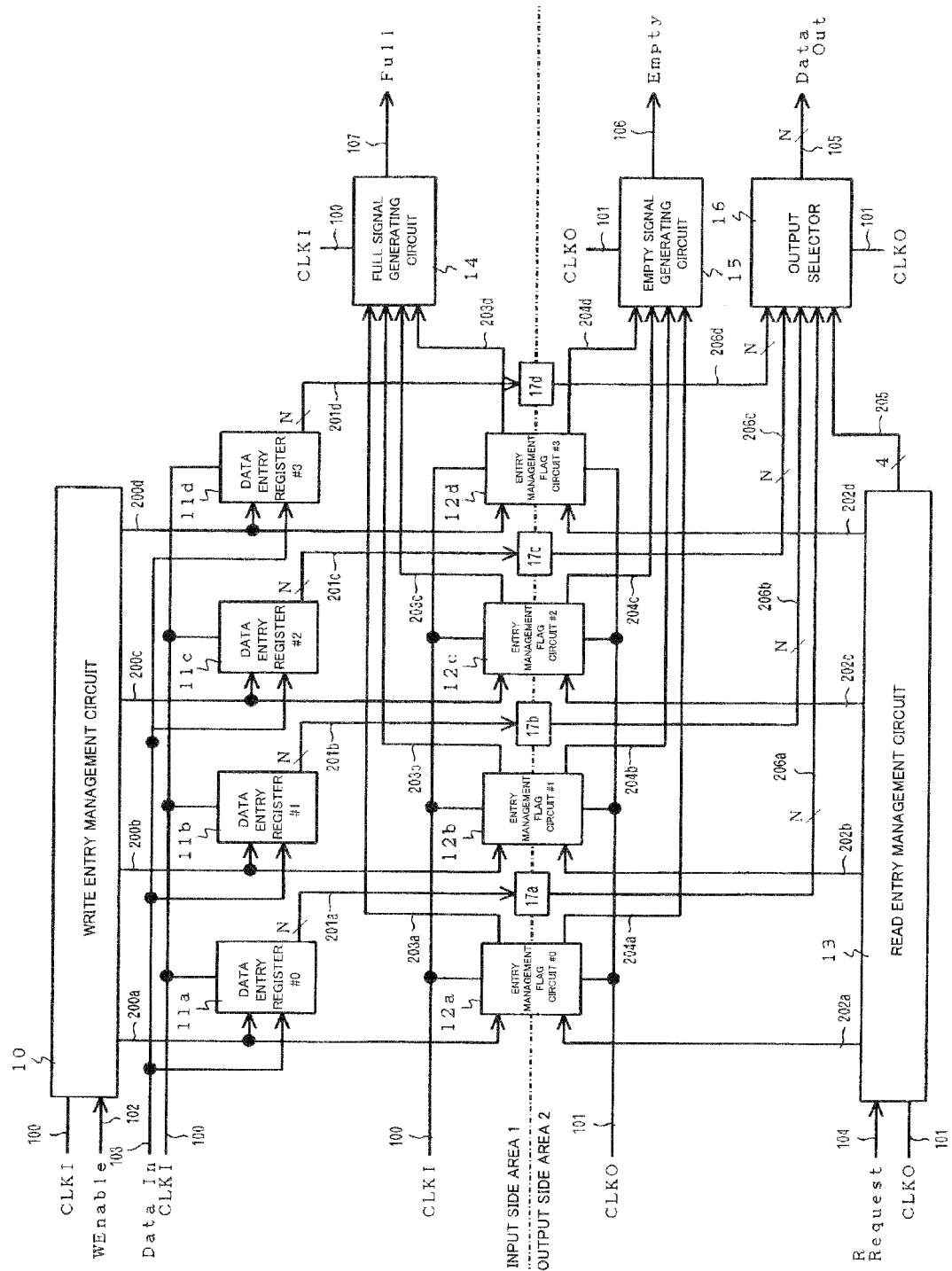
FIG. 2 is a block diagram showing the detailed configuration of the FIFO buffer circuit shown in FIG. 1.

FIG. 2 is a block diagram showing the detailed configuration of the FIFO buffer circuit 7 shown in FIG. 1. In FIG. 2, the FIFO buffer circuit 7 is constituted by a plurality of data entry registers (#0 to #3) 11a to 11d; a write entry management circuit 10 that manages entries to which data are written; a read entry management circuit 13 that manages entries from which data are read; entry management flag circuits (#0 to #3) 12a to 12d that manage the presence or absence of valid data in the respective data entries; a full signal generating circuit 14 that determines whether or not the entries are full from the entry management flag circuits; an empty signal generating circuit 15 that determines the absence of registered data from the entry management flag circuits; an output selector 16 that selects data that should currently be read from the output of each data entry register; and voltage level converting circuits 17a to 17d that convert the voltage levels of the outputs of the data entry registers to the voltage levels of the output side.

Out of these, the write entry management circuit 10, the data entry registers 11a to 11d, and the full signal generating circuit 14 are disposed in the input side area 1, and the read entry management circuit 13, the empty signal generating circuit 15, and the output selector 16 are disposed in the output side area 2. The entry management flag circuits 12a to 12d and the voltage level converting circuits 17a to 17d are disposed on the boundary between the input side area 1 and the output side area 2. They transfer data between areas of different clock frequency and voltage level.

The example shown in FIG. 2 has four entries, however, the number of the entries can easily be changed by changing the number of the data entry registers 11a to 11d and the entry management flag circuits 12a to 12d.

Next, the operation of the FIFO buffer circuit 7 shown in FIG. 2 will be described. We'll assume that there is no valid data in any entry at first and that the write entry management circuit 10 specifies the data entry register (#0) 11a as the next entry to be written to.

After write data have been given to the data input (Data In) 103 and the write enable signal (W Enable) 102 has been validated for one cycle of the input side area clock 100, the write entry management circuit 10 validates an entry write signal 200a. Because of this, the value of the data input is written to the data entry register (#0) 11a and the flag of the entry management flag circuit (#0) 12a is set. These operations are performed according to the timing of the input side area clock.

The data entry register (#0) 11a gives the registered data to the output 201a, has the voltage level converting circuit 17a match the voltage level to that of the output side area 2, and supplies the result to the output selector 16. Further, the entry management flag circuit (#0) 12a outputs a valid signal 203a and invalidates its inverted signal 204a. The empty signal generating circuit 15 that has validated the empty signal 106 in the initial state detects the fact that the inverted signal 204a has been invalidated and invalidates the empty signal 106. In this state, it is possible for the logic circuit connected to the output side to request data.

After receiving the read request signal (R Request) 104 from the output side, the read entry management circuit 13 gives an entry read signal 202a to the entry management flag circuit (#0) 12a. The read entry management circuit 13 gives a selection signal 205 to the output selector 16 and has the output selector 16 output a signal 206a, whose voltage level has been converted, to the data output (Data Out) 105. The request signal, the entry read signal, and the data output signal are generated according to the output side area clock 101. A piece of data can be transmitted between the two circuit areas according to this sequence of operation.

When the write enable signal 102 for writing next data is received, the value of the data input 103 is written to the data entry register (#1) 11b this time and the flag of the entry management flag circuit (#1) 12b is set.

When data are sent one after another, these pieces of data are sequentially written to the data entry register (#2) 11c, the data entry register (#3) 11d, and the data entry register (#0) 11a, and the flags of the entry management flag circuit (#2) 12e, the entry management flag circuit (#3) 12d, and the entry management flag circuit (#0) 12a are set respectively. If no data is read during this time, the full signal generating circuit 14 will validate a full signal 107 since all the valid signals 203a to 203d are valid. If one piece of data is read and there is an empty entry, the full signal 107 will be invalidated.

As described above, the FIFO buffer circuit according to the mode of the present invention can perform data transfer between two circuit areas having different combinations of a power supply voltage and an operation clock frequency by having the voltage level converting circuits 17a to 17d.

Further, in the FIFO buffer circuit according to the mode of the present invention, the voltage level converting circuits are provided between the outputs of the data entry registers (#0 to #3) 11a to 11d and the input of the output selector 16, and inside the entry management flag circuits (#0 to #3) 12a to 12d.

Further, in the FIFO buffer circuit according to the mode of the present invention, when the entry management flag circuits (#0 to #3) 12a to 12d are constituted by asynchronous or synchronous RS-FF (RS-Flip Flop) circuits, the voltage level converting circuits are provided at two locations of the loops of the RS-FF circuits.

Further, in the FIFO buffer circuit according to the mode of the present invention, when the entry management flag circuits are constituted by asynchronous RS-FF circuits comprised of two NOR (NOT-OR) circuits, the voltage level conversions can be also performed simultaneously by constituting the NOR circuits with CVSL (Cascade Voltage Switch Logic) circuits.

In the mode of the present invention, the boundary between two different power supply voltage areas can be disposed at the same place as the boundary between two different clock areas since the voltage level converting circuits are built inside the FIFO buffer circuit, which is on the boundary between the two different clock areas. More particularly, the clock boundary is disposed inside of the entry management flag circuits, and, thus the two boundaries can perfectly be matched by placing the voltage level converting circuits thereat.

Further, in the mode of the present invention, since the clock boundary and the power supply voltage boundary can be matched by using the configuration of the FIFO buffer circuit described above, an area where a single clock tree is formed and an area where a single network of power supply wiring is formed coincide and it becomes easy to design the layout of an integrated circuit.

In other words, a small intermediate area is not necessary in the mode of the present invention since the boundary between areas operating at different power supply voltages and the boundary between areas operating at different clocks can be matched by building the voltage level converting circuits into asynchronous or synchronous RS-FF circuits that manage entries by operating at the both clocks and that become the operation clock boundary in the FIFO buffer circuit and by positioning the boundary between the areas operating at different power supply voltages at the same place as the boundary between the areas operating at different clocks.

Further, in the mode of the present invention, since the small area having a combination of a power supply voltage and a clock frequency different from those of the power supply voltage areas and the clock areas is not present, the power supply wiring network and clock tree can be defined in the same circuit area and the layout design can be done easily.

Example 1

Figure 3:
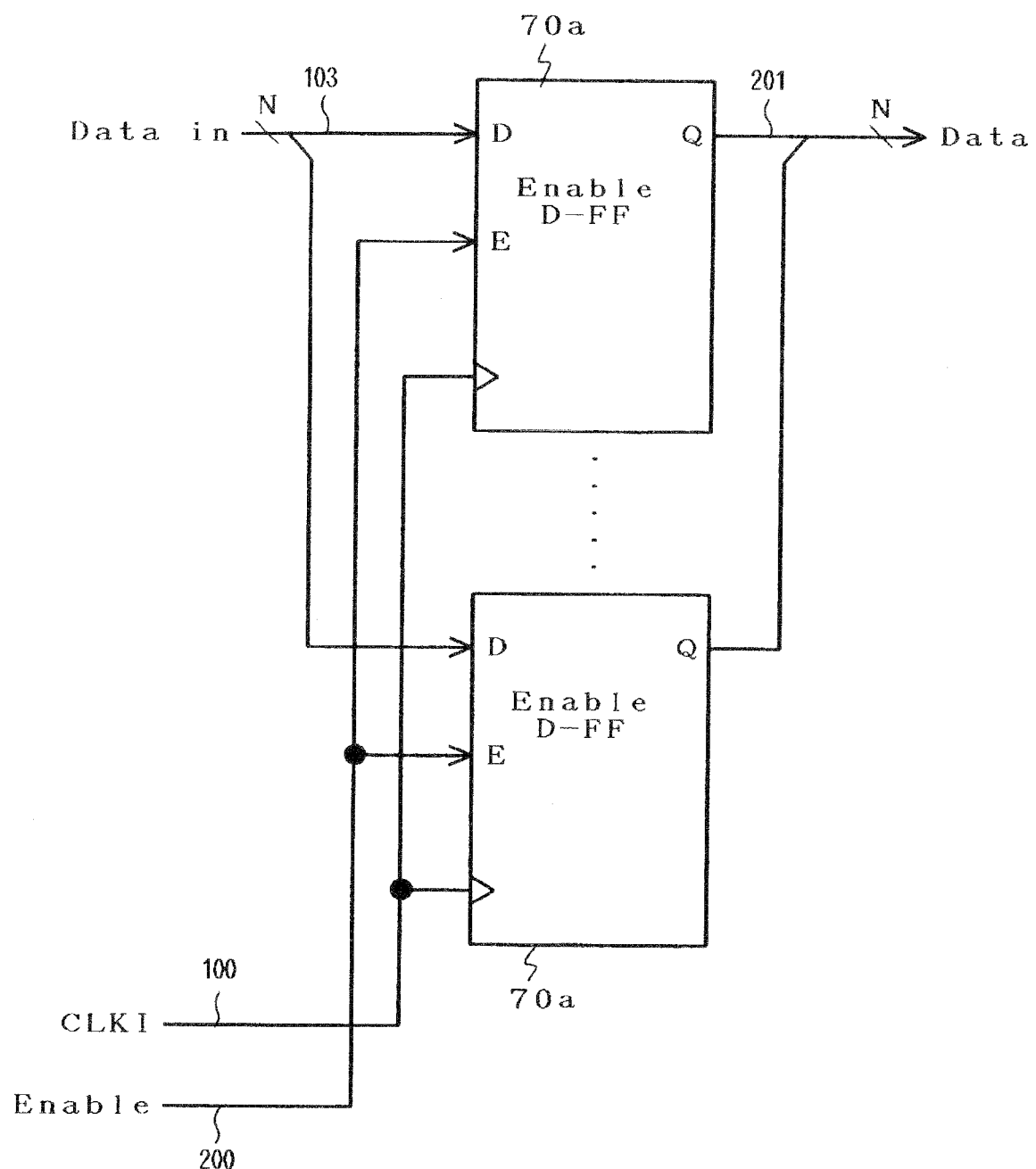
FIG. 3 is a drawing showing a configuration example of a data entry register of a FIFO buffer circuit according to a first example of the present invention.

FIG. 3 is a drawing showing a configuration example of a data entry register of a FIFO buffer circuit according to a first example of the present invention. The configuration of the FIFO buffer circuit according to the first example of the present invention is the same as that of the FIFO buffer circuit according to the mode of the present invention shown in FIGS. 1 and 2, and the first example of the present invention will be described with reference to FIGS. 1 and 2 as well.

In FIG. 3, the data entry register 11 (the data entry registers 11a to 11d in FIG. 2) is constituted by disposing as many D-FF circuits 70a with an enable terminal as the bit number. The data input 103 is supplied to the input of each D-FF (D-Flip Flop) circuit 70a for each bit, and when D-FF circuit 70a receives an entry write signal 200, the data are written to the D-FF circuit 70a. The written data appear at an output 201 at the next clock. The write timing is determined by the input side area clock (CLKI) 100.

Figure 4:
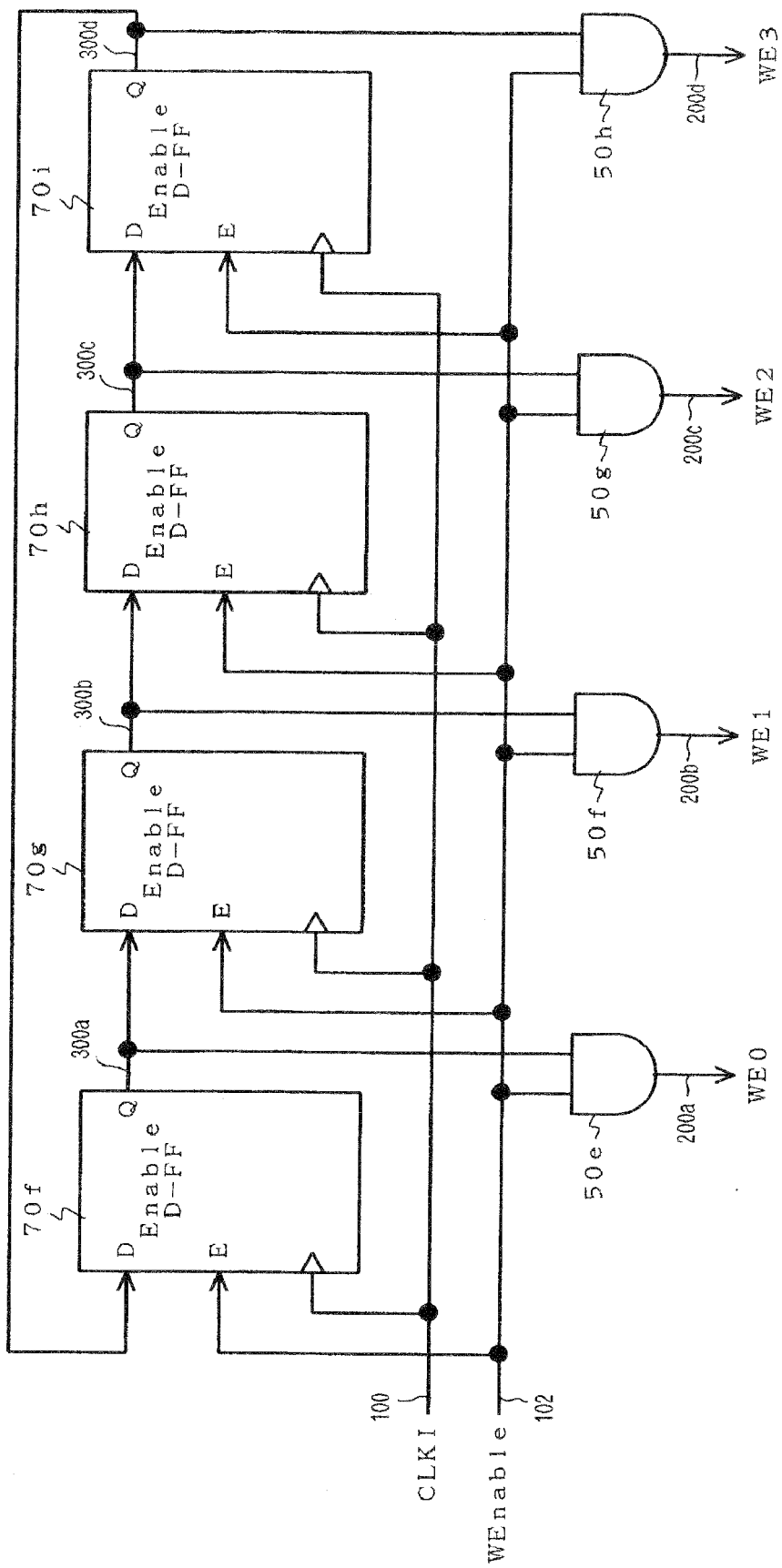
FIG. 4 is a drawing showing a configuration example of a write entry management circuit of the FIFO buffer circuit according to the first example of the present invention.

FIG. 4 is a drawing showing a configuration example of a write entry management circuit of the FIFO buffer circuit according to the first example of the present invention. In FIG. 4, the write entry management circuit 10 is constituted by as many D-FF circuits 70f to 70i with enable terminals as the number of the entries and AND circuits 50e to 50h. D-FF circuits 70f to 70i with enable terminal of the same number of entries are connected in a ring form.

In the initial state, a write entry management flag 300a of an entry (#0) is set and the other write entry management flags 300b, 300c, and 300d are reset. This initial state is created by a reset mechanism (not shown in FIG. 4).

Once the write enable signal 102 is validated, an AND operation of each entry and the management flag is performed by the AND circuits 50e to 50h, only the management flag in the set state and one entry write signal 200a obtained by the AND operation is validated, and the set management flag is moved to the write entry management flag (300b) of the next entry (#1). Every time the write enable signal 102 is validated, the set management flag is moved one by one from the write entry management flag 300a to 300d. As a result, the entry write signal (W0 to W3) [sic., WE0 to WE3] outputted is moved one by one from 200a to 200d.

Figure 5:
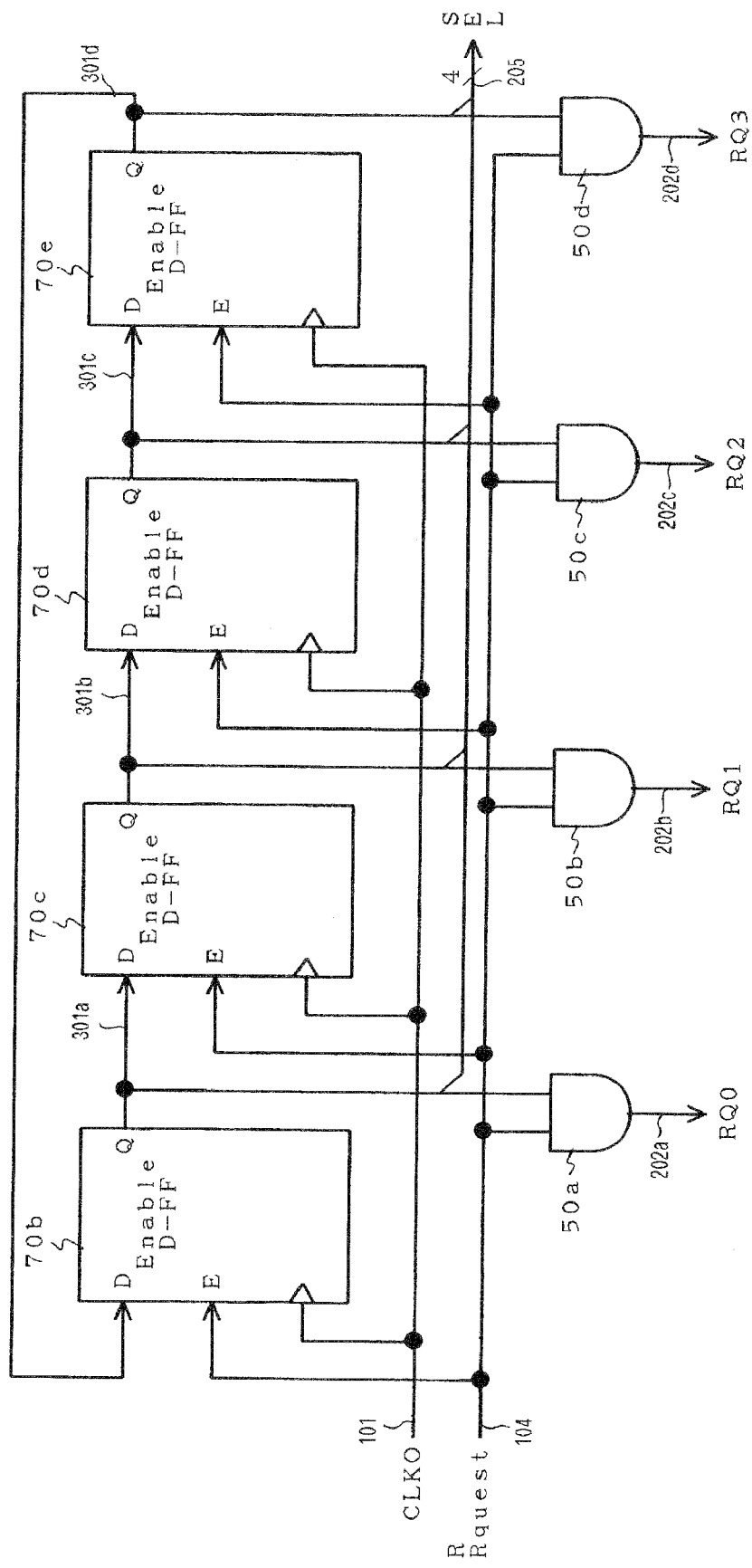
FIG. 5 is a drawing showing a configuration example of a read entry management circuit of the FIFO buffer circuit according to the first example of the present invention.

FIG. 5 is a drawing showing a configuration example of a read entry management circuit of the FIFO buffer circuit according to the first example of the present invention. In FIG. 5, the read entry management circuit 13 is constituted by as many D-FF circuits 70b to 70e with enable terminal as the number of the entries and AND circuits 50a to 50d. The D-FF circuits 70b to 70e with enable terminal are connected in a ring form.

In the initial state, the read entry management flag 301a of the entry (#0) is set and all the other read entry management flags 301b, 301c, and 301d are reset. This initial state is created by a reset mechanism (not shown in FIG. 5).

Once the read request signal 104 is validated, an AND operation of each entry and the management flag is performed by the AND circuits 50a to 50d, only the management flag in the set state and one entry read signal 202a obtained by the AND operation is validated, and the set management flag is moved to the read entry management flag 301b of the next entry (#1).

Every time the read enable signal 104 is validated, the set management flag is moved one by one from the read entry management flag 301a to 301d. Further, the management flag is outputted as the selection signal (SEL) 205 to the output selector 16.

Figure 6:
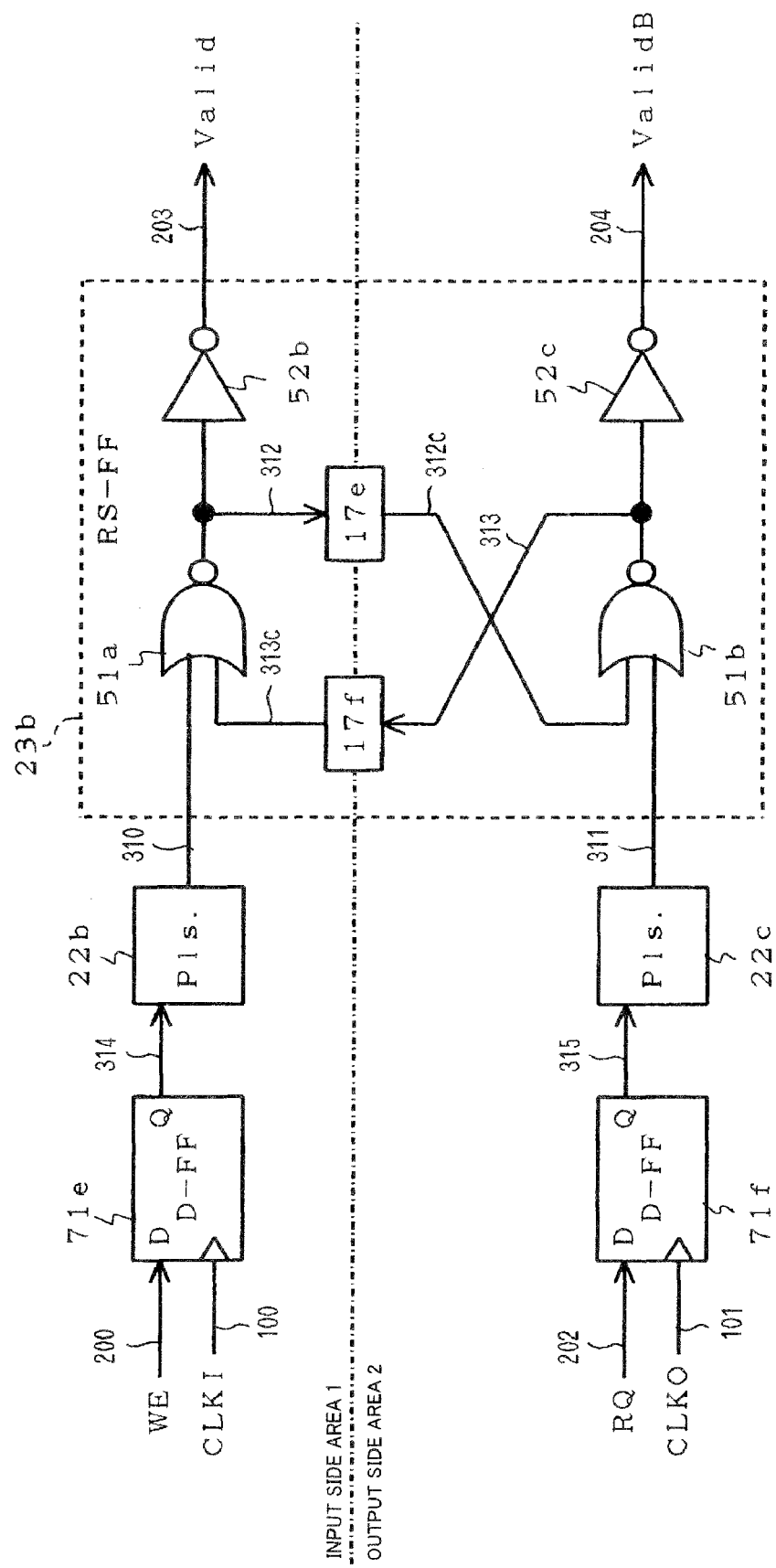
FIG. 6 is a drawing showing a configuration example of an entry management flag circuit of the FIFO buffer circuit according to the first example of present invention.

FIG. 6 is a drawing showing a configuration example of an entry management flag circuit of the FIFO buffer circuit according to the first example of present invention. In FIG. 6, the entry management flag circuit 12 (the entry management flag circuits 12a to 12d shown in FIG. 2) is constituted by D-FF circuits 71e and 71f, pulse generators (PLs.) 22b and 22c, and an RS-FF circuit 23b; and the RS-FF circuit 23b is constituted by NOR circuits 51a and 51b, and inverters 52b and 52c.

The entry write signal (WE) 200 and the entry read signal (RQ) 202 are held by the D-FF circuits 71e and 71f with the input side area clock 100 and the output side area clock 101, respectively, and they validate the outputs for a period of one clock cycle. Receiving the validated outputs, the pulse generators 22b and 22c generate pulses and give them to either a set signal 310 or reset signal 311 for the RS-FF circuit 23b.

In the RS-FF circuit 23b, two NOR circuits 51a and 51b are connected in a loop-like fashion and their respective output is inverted by the inverter 52b, 52c. The resultant signals are outputted as the valid signal 203 (the valid signals 203a to 203d in FIG. 2) and its inverted signal 204 (the inverted signal 204a to 204d in FIG. 2). Two voltage level converting circuits 17e and 17f are provided in the loop of the NOR circuits 51a and 51b in the RS-DD circuit 23b.

Since the input side area 1, the upper half of FIG. 6, and the output side area 2, the lower half, operate at different power supply voltages, the voltage level of the signals need to be converted. When the RS-FF circuit is configured as described above, a part of the loop forming the RS-FF circuit is included in the input side area 1 and operates at the power supply voltage of the input side, and the remaining part of the loop is included in the output side area 2 and operates at the power supply voltage of the output side. At this time, the set terminal 310 of the RS-FF circuit belongs to the input side area and the reset terminal 311 belongs to the output side area. Further, each area operates at a different clock, but there is no timing issue since the RS-FF circuit 23b is asynchronous.

Figure 7:
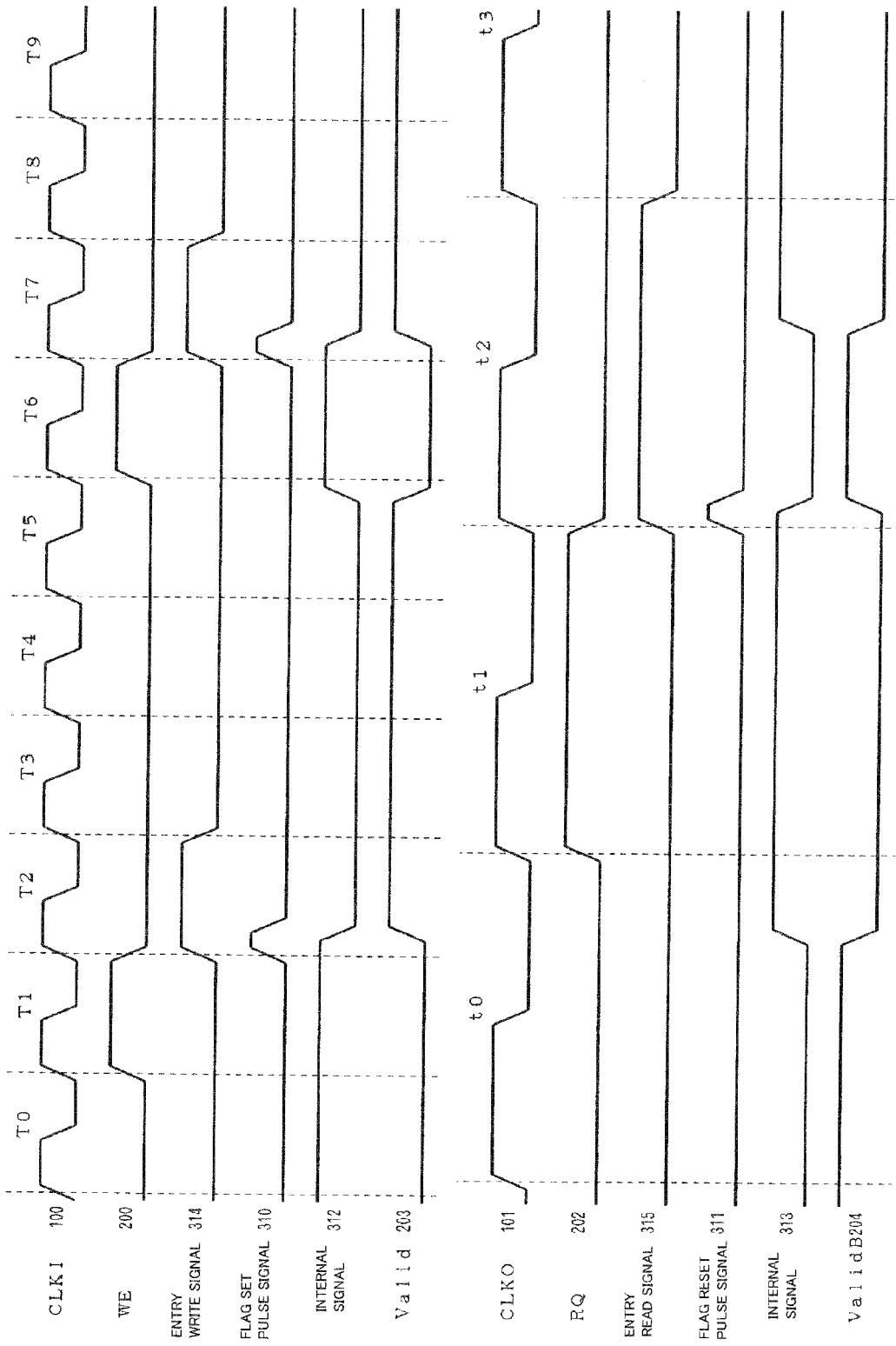
FIG. 7 is a timing chart describing the operation of the entry 340 management flag circuit 12 shown in FIG. 6.

FIG. 7 is a timing chart illustrating the operation of the entry management flag circuit 12 shown in FIG. 6. In FIG. 7, the cycle (period) of the input side area clock (CLKI) 100 is shorter than the cycle (period) of the output side area clock (CLKO) 101.

When the entry write signal (WE) 200 becomes valid at timing T1, it is held by the D-FF circuit 71e and a pulse of one clock cycle (period) duration appears in the output signal 314 of the D-FF circuit 71e at timing T2. When the pulse generator 22b detects the rising edge of this signal and generates a pulse signal 310, the entry data valid signal 203 rises up via the NOR circuit 51a and the inverter circuit 52b. Meanwhile the inverted signal 204 of the entry data valid signal rises up (turns down).

Next, when the entry read signal (RQ) 202 becomes valid at the timing t1, it is held by the D-FF circuit 71f and a pulse of one clock cycle duration appears in the output signal 315 of the D-FF circuit 71f at the next timing t2. When the pulse generator 22c detects the rising edge of this signal and generates a pulse signal 311, the inverted signal 204 of the entry data valid signal rises up (turns down) via the NOR circuit 51b and the inverter circuit 52c, and the entry data valid signal 203 rises up.

The NOR circuit 51a and the NOR circuit 51b form a loop via the voltage level converting circuits 17e and 17f, and perform the operation of the asynchronous RS-FF circuit 23b along with the inverter circuits 52b and 52c. Since the entry write signal 200 and the entry read signal 202 are the outputs of the looped D-FF circuits with enable terminal in the write entry management circuit 10 and the read entry management circuit 13, they don't become valid consecutively and the internal signals 314 and 315 received by the pulse generators 22b and 22c are always pulses of one clock cycle duration. Further, since the input signal of the RS-FF circuit 23b is a pulse signal, a malfunction will not occur even if the cycles (period) of the input side area clock 100 and the output side area clock 101 differ greatly.

For instance, if a pulse of one clock cycle duration such as a cycle t2 of the internal signal 315 be directly fed to the RS-FF circuit 23b, even when the circuit be set by the internal signal 314 with a pulse of a cycle T7, after this pulse has fallen, the circuit will be reset again since the pulse of the internal signal 315 will still be valid. The first example of the present invention avoids this by using pulse signals as the input.

Figure 8:
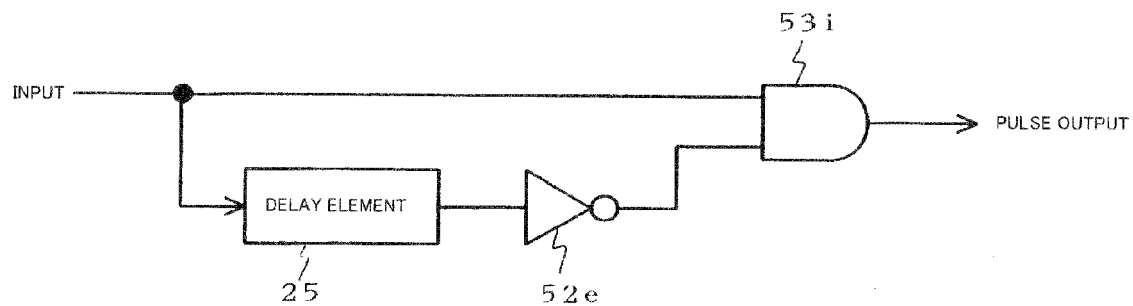
FIG. 8 is a drawing showing a configuration example of the pulse generator of the FIFO buffer circuit according to the first example of the present invention.

FIG. 8 is a drawing showing a configuration example of the pulse generator of the FIFO buffer circuit according to the first example of the present invention. In FIG. 8, the pulse generator is constituted by a delay element 25, an inverter 52e, and an AND circuit 53i.

In the pulse generator, after an input signal has been delayed by the delay element 25 and inverted by the inverter 52e, the AND circuit 53i performs an AND operation of the resultant signal and the original signal. Since the input pulse is masked by a slightly delayed signal, a pulse occurs simultaneously with the rising edge.

Figure 9:
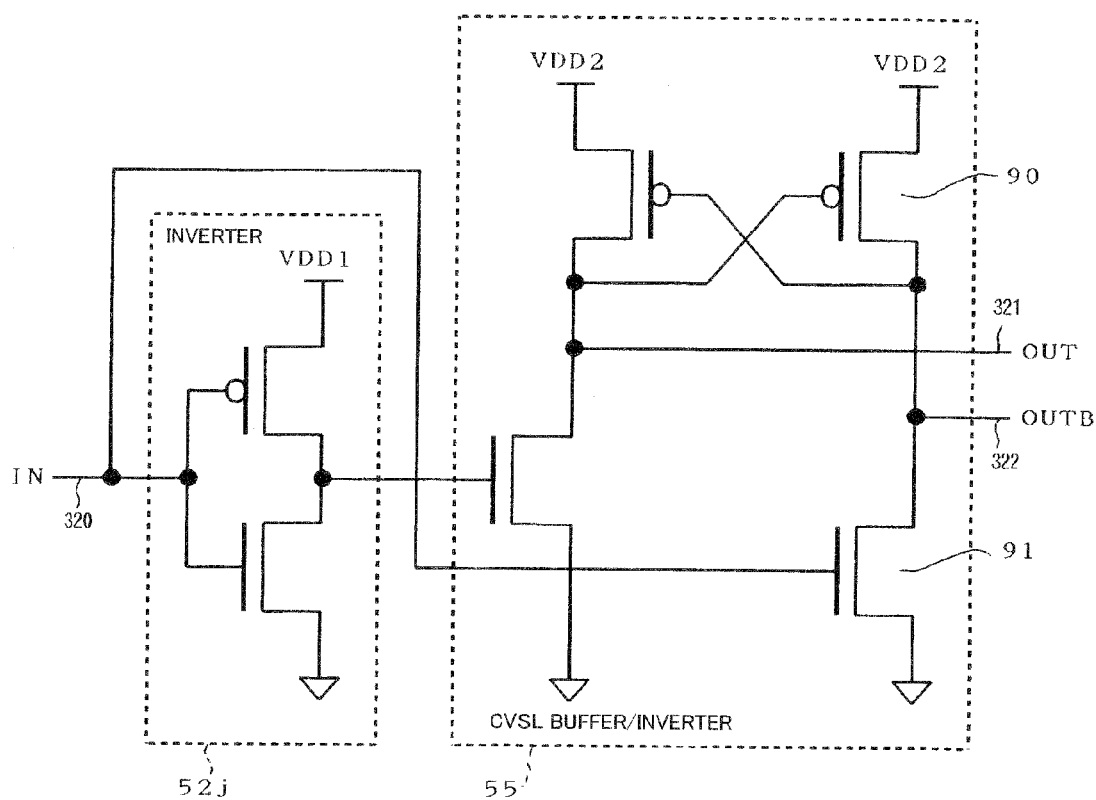
FIG. 9 is a drawing showing a configuration example of a voltage level converting circuit of the FIFO buffer circuit according to the first example of the present invention.

FIG. 9 is a drawing showing a configuration example of the voltage level converting circuit of the FIFO buffer circuit according to the first example of the present invention. In FIG. 9, the voltage level converting circuit according to the first example of the present invention uses a CVSL circuit and is constituted by an inverter 52j and a CVSL buffer/inverter 55.

When the CVSL buffer/inverter 55 receives differential signals at inputs made up of an nMOS transistor 91, it outputs signals having the voltage level VDD2 from an output 321 and its inverted output 322 with a help of a cross-connected pMOS transistor 90. The inverter 52j is provided to generate a complementary signal to the input signal 320 having the voltage level VDD1. This voltage level converting circuit outputs a high level signal from the output 321 and its inverted signal 322 at a low level respectively when the input 320 is at a high level.

Figure 10:
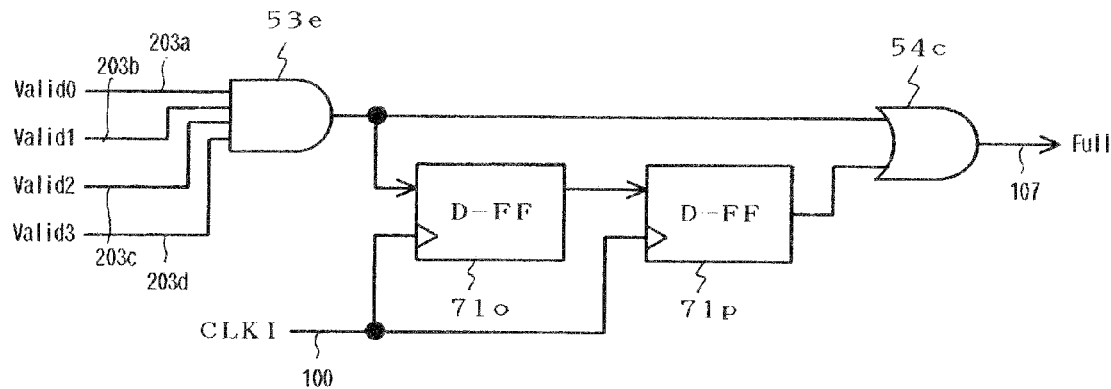
FIG. 10 is a drawing showing a configuration example of a full signal generating circuit of the FIFO buffer circuit according to the first example of the present invention.

FIG. 10 is a drawing showing a configuration example of a full signal generating circuit (the full signal generating circuit 14 shown in FIG. 2) of the FIFO buffer circuit according to the first example of the present invention. In FIG. 10, the full signal generating circuit 14 is constituted by an AND circuit 53e, an OR circuit 54c, and D-FF circuits 71o and 71p. The AND circuit 53e performs an AND operation of the valid signals 203a to 203d of each entry and immediately when all the entry management flags become valid and full, it issues a full signal 107 so that no more data are registered to the entries.

Setting of the entry management flag(s) is performed when data are registered to the entries. It is an event synchronized to the input side area clock 100. Further, since the full signal 107 is also returned to the input side area 1, the delay amounts of all the signals on this path are determined in relation to the input side area clock 100. Therefore, the full signal generating circuit 14 can issue the full signal 107 right away (within one clock) without going through the D-FF circuit for synchronization.

On the other hand, since resetting of the entry management flag is preformed by the read request signal 104 from the output side area 2, the full signal 107 needs to be fallen down via the two-staged D-FF circuits 71o and 71p, synchronizing to the input side area clock 100. The OR circuit 54c performs an OR operation of the output of the AND circuit 53e and the output of the D-FF circuit 71p and generates the full signal 107.

Figure 11:
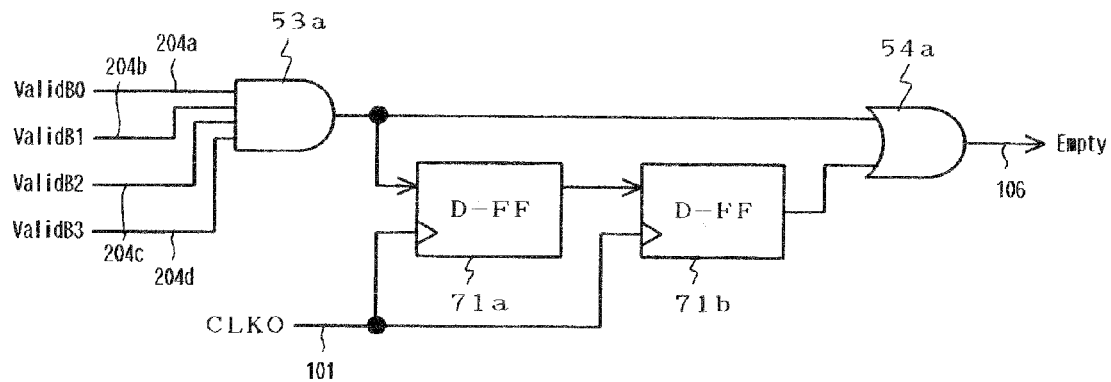
FIG. 11 is a drawing showing a configuration example of an empty signal generating circuit of the FIFO buffer circuit according to the first example of the present invention.

FIG. 11 is a drawing showing a configuration example of an empty signal generating circuit (the empty signal generating circuit 15) of the FIFO buffer circuit according to the first example of the present invention. In FIG. 11, the empty signal generating circuit 15 has the same configuration as that of the full signal generating circuit 14 in FIG. 10 and is constituted by an AND circuit 53a, an OR circuit 54a, and D-FF circuits 71a and 71b. As soon as all the entry management flags are reset (the inverted signal 204 of the valid signal rises up), the empty signal generating circuit 15 issues an empty signal 106 because it is in an empty state.

Resetting of the entry management flag is performed when data are read from the entries. It is an event synchronized to the output side area clock 101. Further, since the empty signal 106 is also returned to the output side area 2, the delay amounts of all the signals on this path are determined in relation to the output side area clock 101. Therefore, the empty signal generating circuit 15 can issue the empty signal 106 right away (within one clock) without going through the D-FF circuit for synchronization.

On the other hand, since the entry management flags are set by the write enable signal 102 from the input side area 1, the empty signal 106 needs to be fallen down via the two-staged D-FF circuits 71a and 71b, synchronizing to the output side area clock 101. The OR circuit 54a performs an OR operation of the output of the AND circuit 53a and the output of the D-FF circuit 71b and generates the empty signal 106.

Figure 12:
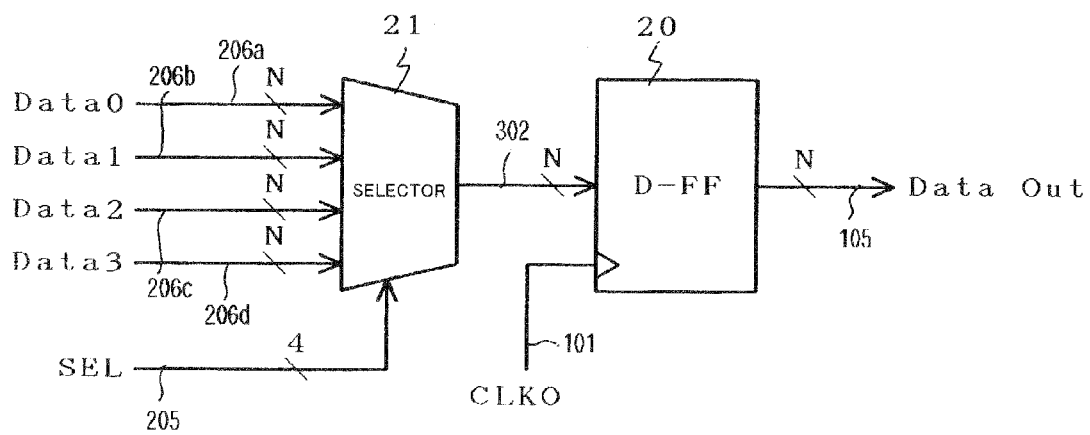
FIG. 12 is a drawing showing a configuration example of the output selector of the FIFO buffer circuit according to the first example of the present invention.

FIG. 12 is a drawing showing a configuration example of the output selector (the output selector 16 shown in FIG. 2) of the FIFO buffer circuit according to the first example of the present invention. In FIG. 12, the output selector 16 is constituted by a selector 21 and a D-FF circuit 20.

The selector 21 has as many inputs (Data0 to Data3) 206a to 206d as the number of the entries, and when it receives the selection signal 205 from the read entry management circuit 13 as the control signal, it selects one piece of data. Data 302 selected by the selector 21 is held by the D-FF circuit 20 and outputted from a data output 105.

Figure 13:
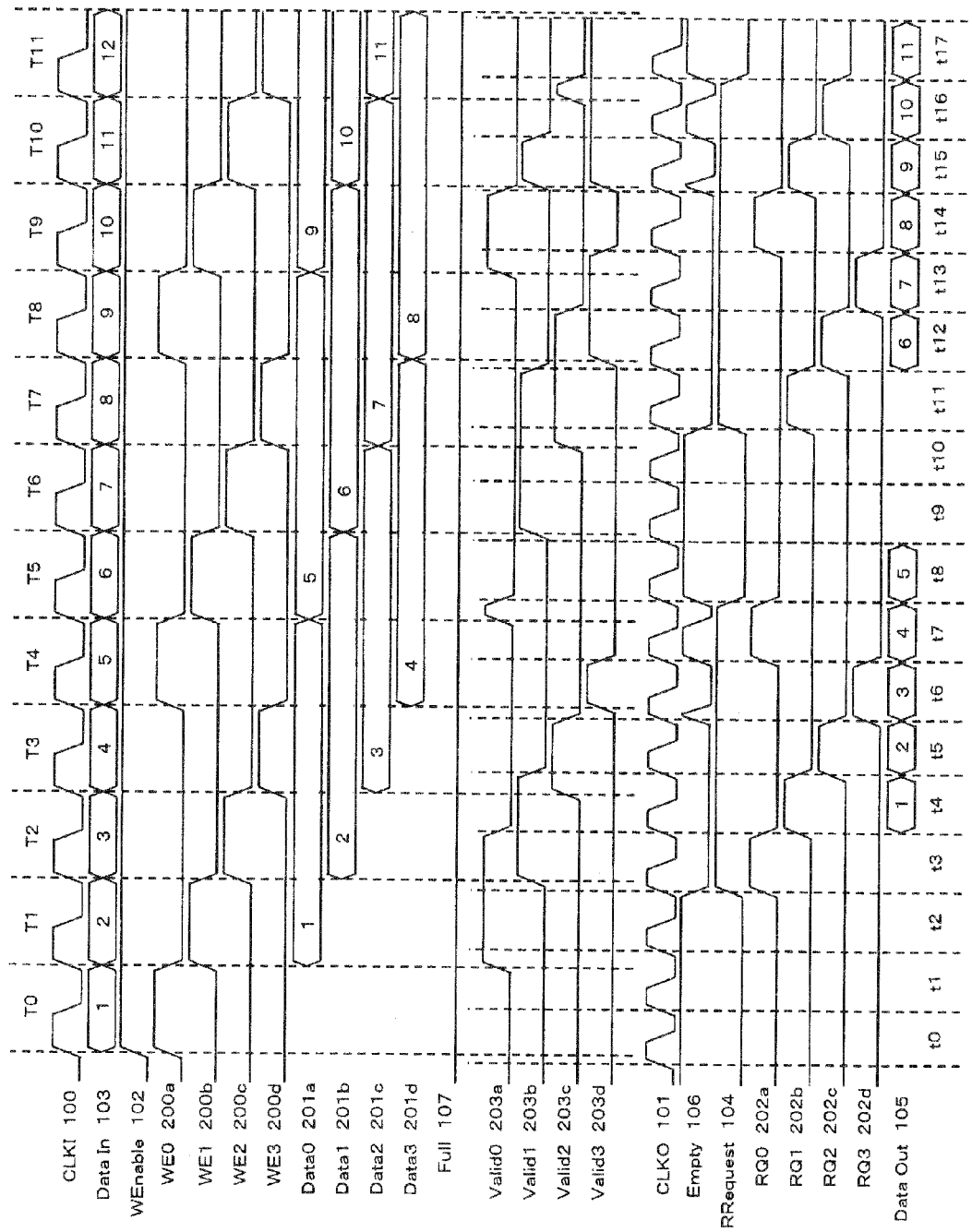
FIG. 13 is a timing chart showing an operation example of the FIFO buffer circuit according to the first example of the present invention.
Figure 14:
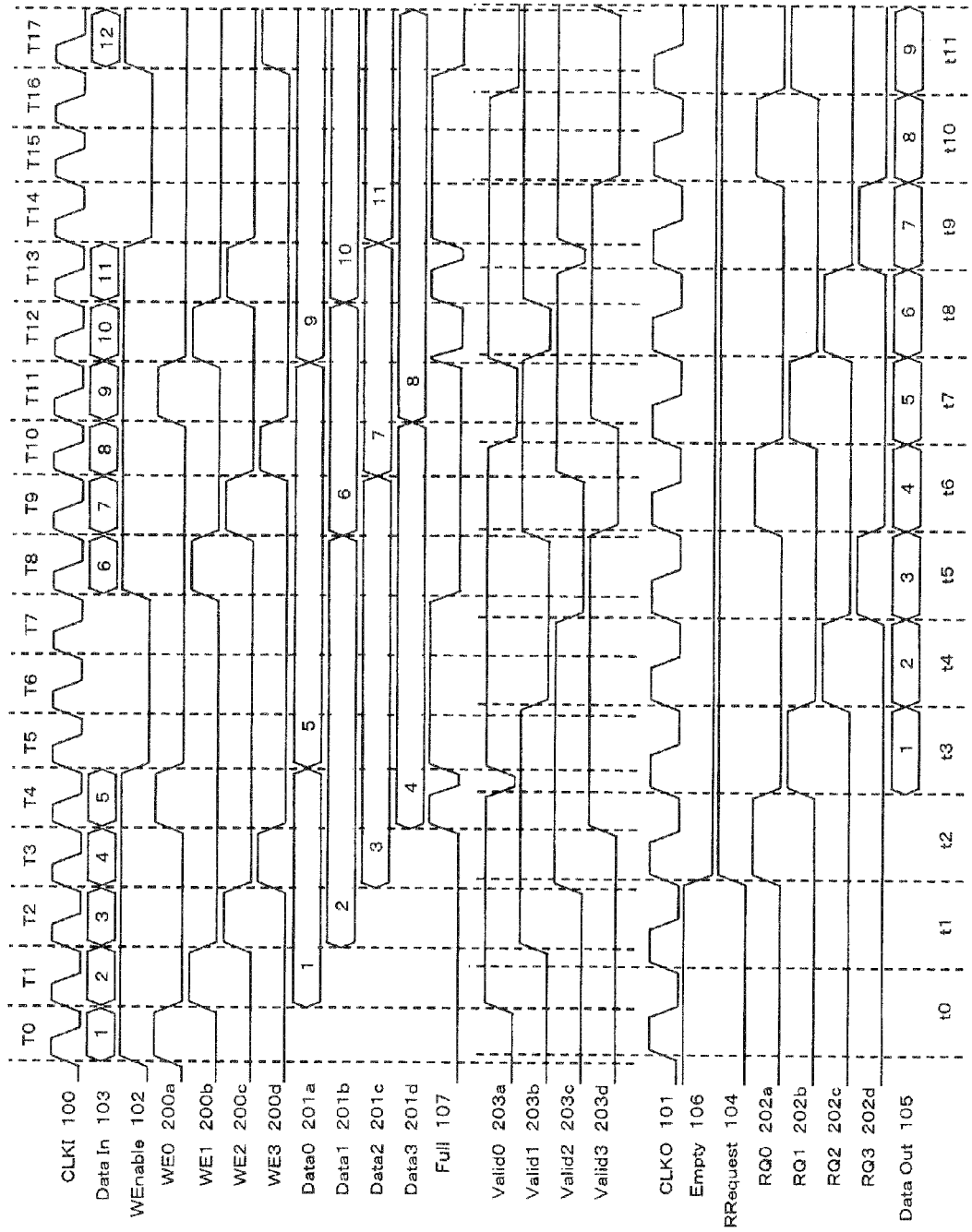
FIG. 14 is a timing chart showing an operation example of the FIFO buffer circuit according to the first example of the present invention.

FIGS. 13 and 14 are timing charts showing operation examples of the FIFO buffer circuit according to the first example of the present invention. The operation of the FIFO buffer circuit according to the first example of the present invention will be described with reference to FIGS. 1 to 14. FIG. 13 shows an example in which the cycle (period) of the input side area clock 100 is longer than that of the output side area clock 101, and the data input 103 sequentially receives data.

Data 1 are received at timing T0 and registered to the data entry register (#0) 11a. As a result, the data 1 appear at the data output 201a at timing T1. Further, the entry management flag circuit (#0) 12a is set and the valid signal 203a rises up.

Next, data 2 received at the timing T1 and registered to the data entry register (#1) 11b. The data 2 appear at the data output 201b at timing T2 and a valid signal 203b rises up. Then, data 3 and data 4 are registered to the data entry register (#2) 11c and the data entry register (#3) 11d, respectively.

Two clocks after the first valid signal 203a has been set in the output side area clock 101, when the empty signal 106 becomes invalid at timing t3, the logic circuit on the output side issues the read request signal 104. As a result, the read entry management circuit 13 issues the entry read signal 202a at the timing t3 and the valid signal 203a falls at timing t4. At the same time, the data 1 are read from the data entry register (#0) 11a. Since the empty signal is still invalid, data can be read continuously. The data 2 are read from the data entry register (#1) 11b at timing t5 and the data 3 are read from the data entry register (#2) 11c at timing t6.

Then, when data 5 is read from the data entry register (#0) 11a at timing t8, data registration proceeds behind, causing the empty signal 106 to become valid. Thus the read request signal 104 falls and the read operation is stopped temporarily. During this time, the write operation can continue to write data and the read operation can resume when the empty signal 106 becomes invalid again at timing t11. Since the cycle of the input side area clock 100 is longer in FIG. 13, the entries do not get full during the operation described above.

FIG. 14 shows an example in which the cycle (period) of the input side area clock 100 is shorter than that of the output side area clock 101. The data 1 are written at the timing T0 and registered to the data entry register (#0) 11a. As a result, the data 1 appear at the data output 201a at the timing T1. At the same time, the entry management flag circuit (#0) 12a is set and the valid signal 203a rises up.

On the output side, the empty signal 106 becomes invalid at timing t2, two clocks after the above operation. Then, when the logic circuit on the output side issues the read request signal 104, the read entry management circuit 13 issues the entry read signal 202a and the entry management flag circuit (#0) 12a is reset. Further, the data 1 is read at the timing t3.

Data are continued to be written on the input side, however, since the read speed is slow, the entries become full at timing T5, and the full signal 107 becomes valid. Then the write enable signal 102 becomes invalid. There appears an empty entry at timing t4, however, in the input side area 1, the full signal 107 becomes invalid at timing T8, two clocks after synchronizing, and the write operation is resumed. The read operation continues and the empty signal 106 does not become valid during this operation.

As described above, in the present example, a small intermediate area does not appear since the boundary between areas having different power supply voltages and the boundary between areas operating at different clocks can be matched by incorporating the voltage level converting circuits into the asynchronous or synchronous RS-FF circuits that manage entries by operating at the both clocks and that are the operation clock boundary in the FIFO buffer circuit and by positioning the boundary between the areas having different power supply voltages at the same place as the boundary between the areas operating at different clocks.

Further, in the present example, since the small area having a combination of a power supply voltage and a clock frequency different from those of the power supply voltage areas and the clock areas is not present, the power supply wiring network and clock tree can be defined in the same circuit area and the layout design can be done easily.

Example 2

Figure 15:
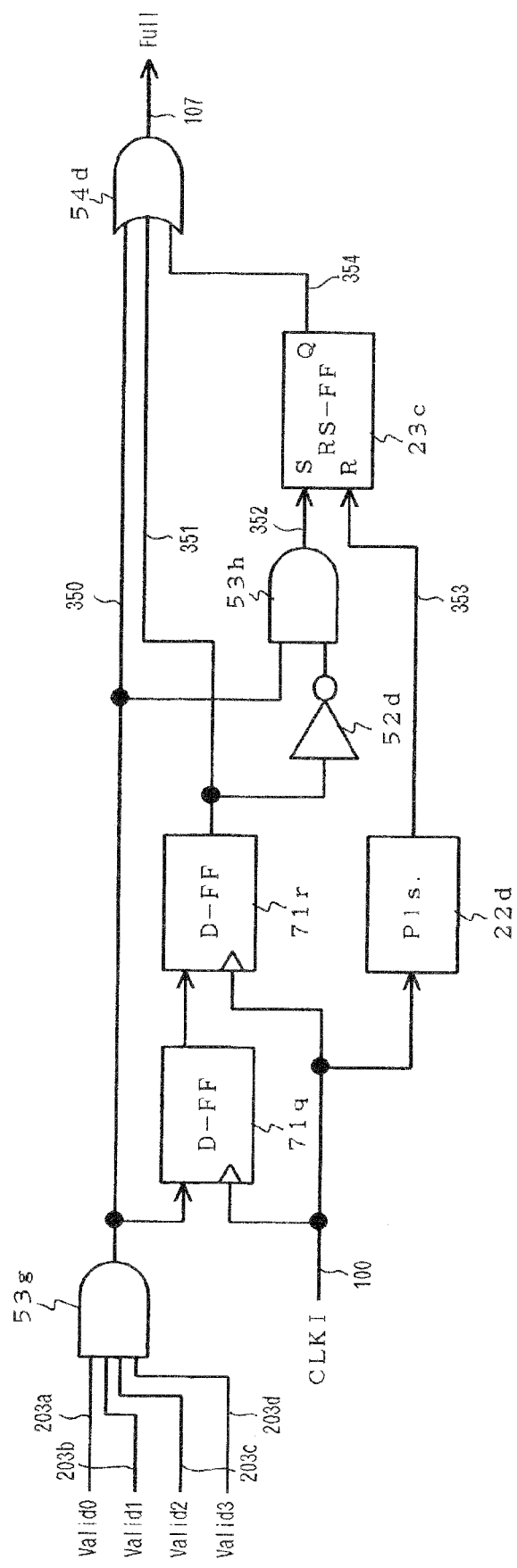
FIG. 15 is a drawing showing a configuration example of a full signal generating circuit of a FIFO buffer circuit according to a second example of the present invention.

FIG. 15 is a drawing showing a configuration example of a full signal generating circuit of a FIFO buffer circuit according to a second example of the present invention. The configuration of the FIFO buffer circuit according to the second example of the present invention is the same as that of the FIFO buffer circuit according to the mode of the present invention shown in FIGS. 1 and 2, and the second example of the present invention will be described with reference to FIGS. 1 and 2. In FIG. 15, the full signal generating circuit is constituted by an inverter 52d, AND circuits 53g and 53h, an OR circuit 54d, D-FF circuits 71q and 71r, a pulse generator 22d, and an RS-FF circuit 23c.

As evident by the timing chart shown in FIG. 14, for instance, although the full signal 107 is temporarily generated within a clock cycle at timing T4, it is immediately cancelled since the data of the entry #0 is read. However, the timing of the cancellation is created by the read request signal 104 supplied in synchronization with the output side area clock 101 and the timing of the falling edge of the full signal 107 and the timing of the rising edge of the input side area clock 100 is very close. As a result, the setup may not be completed.

However, when the inverter 52d and the AND circuit 53h detect the state in which the full signal 107 rises up (a state in which a signal 351 locked to the input side area clock 100 is at a low level and an output 350 of the AND circuit 53g is at a high level), the RS-FF circuit 23c is set and its clock indicates that it is in a full state. Since the RS-FF circuit 23c is reset every clock cycle synchronously to the rising edge of the input side area clock 100, the full state is evaluated again at the next clock cycle. In the present example, the timing error of the full signal 107 can be avoided by this mechanism.

Figure 16:
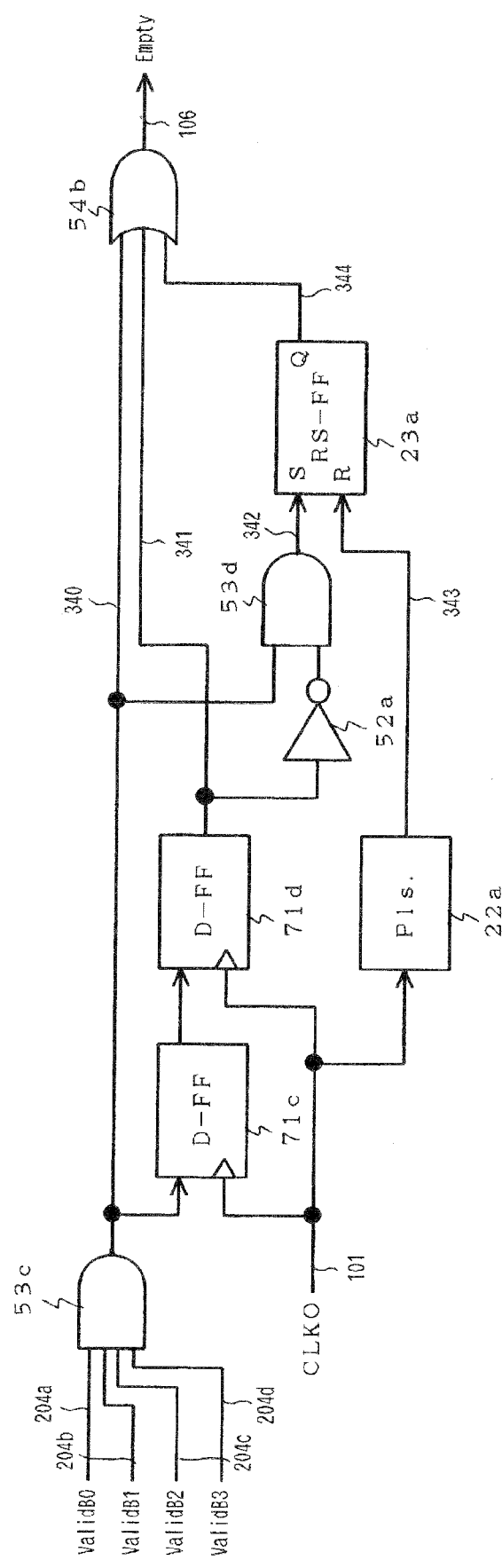
FIG. 16 is a drawing showing a configuration example of an empty signal generating circuit of the FIFO buffer circuit according to the second example of the present invention.

FIG. 16 is a drawing showing a configuration example of an empty signal generating circuit of the FIFO buffer circuit according to the second example of the present invention. In FIG. 16, the empty signal generating circuit is constituted by an inverter 52a, AND circuits 53c and 53d, the OR circuit 54b, D-FF circuits 71c and 71d, a pulse generator 22a, and an RS-FF circuit 23a.

As evident by the timing chart shown in FIG. 13, after the empty signal 106 is temporarily generated, it is cancelled within the same clock cycle at timings t6 and t7, similarly to the case of the full signal 107. A timing error might occur since the timing of the falling edge of the empty signal 106 is synchronized to the input side area clock 100. In order to avoid this, the RS-FF circuit 23a is employed, as in the full signal generating circuit shown in FIG. 15, so that the empty state is maintained throughout the clock cycle in which the empty signal 106 is once generated.

Since the RS-FF circuit 23a is reset every clock cycle synchronously to the rising edge of the output side area clock 101, the empty state is evaluated again at the next clock cycle. In the present example, the timing error of the empty signal 106 can be avoided by this mechanism.

Example 3

Figure 17:
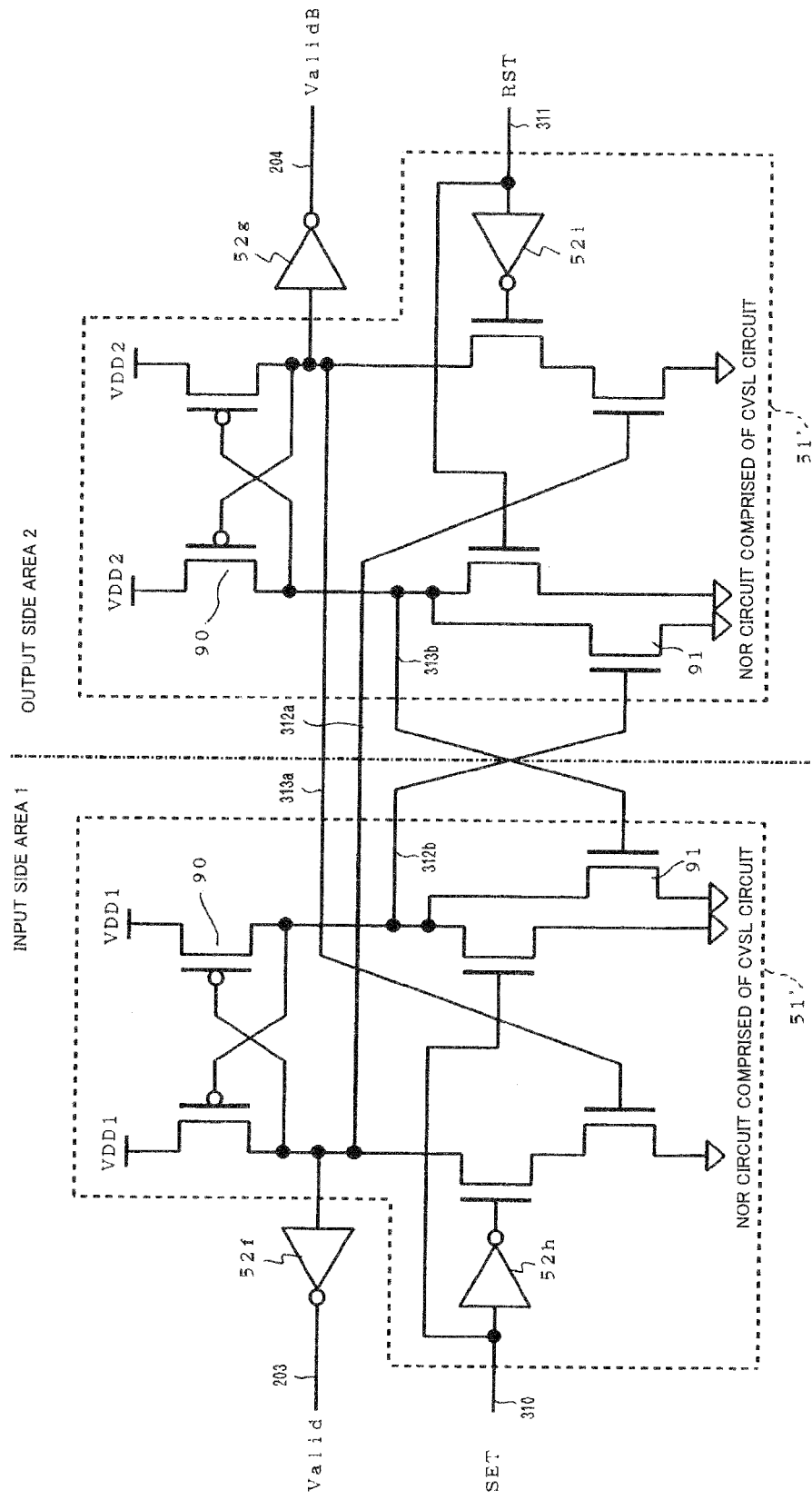
FIG. 17 is a drawing showing a configuration example of the entry management flag circuit of the FIFO buffer circuit according to the second example of the present invention.

FIG. 17 is a drawing showing a configuration example when an RS-FF circuit 23b in an entry management flag circuit of an FIFO buffer circuit according to a third example of the present invention is constituted by CVSL circuits. The configuration of the FIFO buffer circuit according to the third example of the present invention is the same as that of the FIFO buffer circuit according to the mode of the present invention shown in FIGS. 1 and 2, and the third example of the present invention will be described with reference to FIGS. 1 and 2. In FIG. 17, the RS-FF circuit 23b is constituted by two loop-connected NOR circuits 51' comprised of CVSL circuits.

In the RS-FF circuit 23b, a loop is formed by cross-connecting two NOR circuits 51' comprised of CVSL circuits. One of the two NOR circuits 51' comprised of CVSL circuits operates at the first power supply voltage VDD1 and the other operates at the second power supply voltage VDD2. Since the CVSL circuits also perform voltage level conversion, the operation of the RS-FF circuit and voltage level conversion can be performed at the same time. Although the RS-FF circuit is constituted by CVSL circuits, a part of the loop in the RS-FF circuit operates at the power supply voltage VDD1 and the remaining part operates at the power supply voltage VDD2. Further, a set terminal of the RS-FF circuit receives a signal having the level of VDD1 and a reset terminal receives a signal having the level of VDD2.

Figure 18:
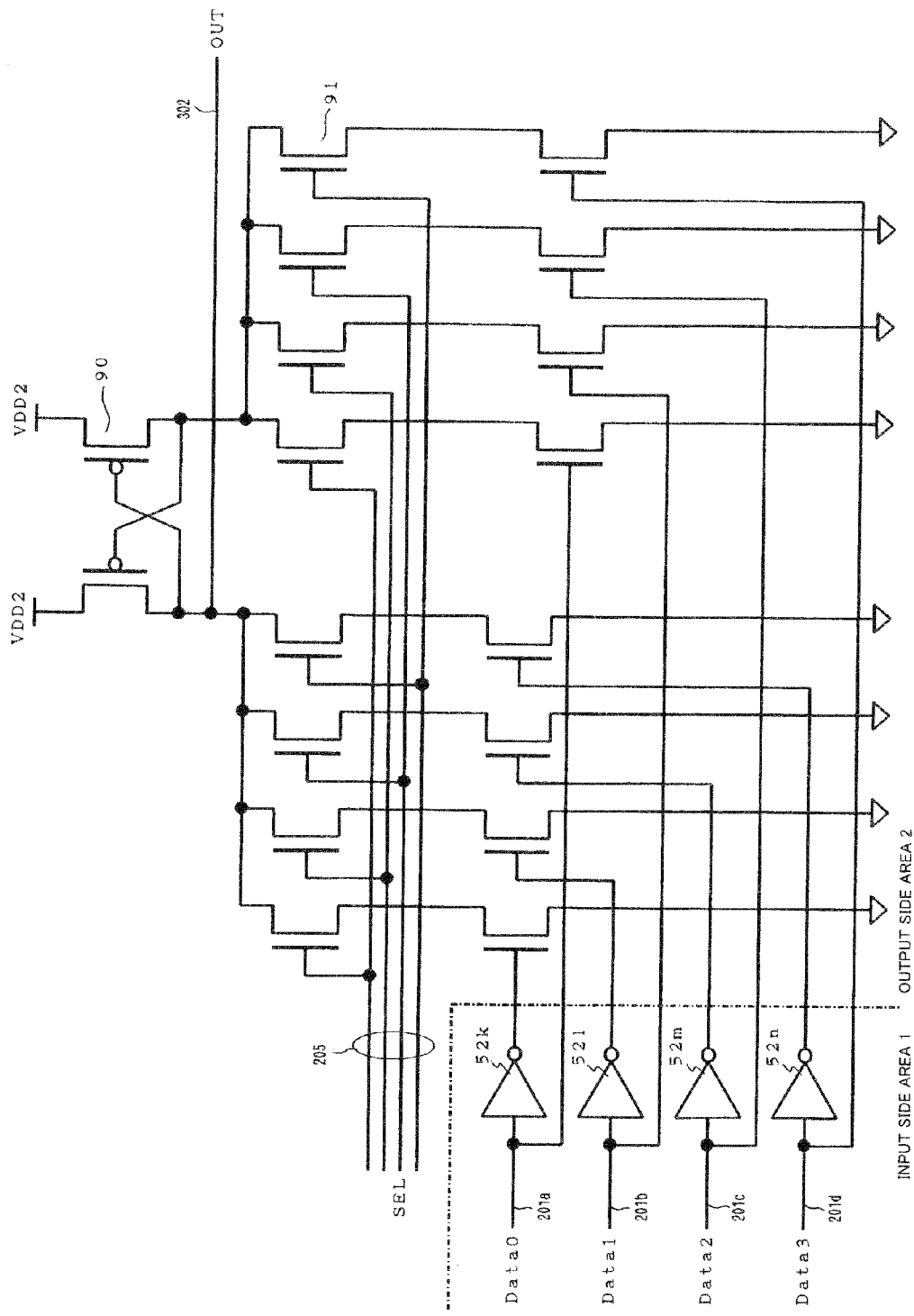
FIG. 18 is a drawing showing a circuit configuration example when an output selector of the FIFO buffer circuit according to a third example of the present invention is constituted by a CVSL circuit.

FIG. 18 is a drawing showing a circuit configuration example when an output selector of the FIFO buffer circuit according to the third example of the present invention is constituted by a CVSL circuit. In FIG. 18, since the voltage levels of the data 206 (the data 206a to 206d in FIG. 2) fed to the output selector 16 shown in FIG. 2 have been converted by the voltage level converting circuit 17 (the voltage level converting circuit 17 shown in FIG. 2) in the present example, these data can be simultaneously processed by the CVSL circuit.

In FIG. 18, two nMOS transistors 91 are connected in series and an output node 302 and its complementary signal node are pulled down. The transistor close to the output node is for selection and the selection signal 205 is supplied to the gate. Any one pair (of the two transistors) becomes conductive and reflects a single result from the four pieces of the data 0 to 3. In this case, one of the two nodes is pulled down, outputting the result from an output 302.

Example 4

It is possible to constitute the FIFO buffer circuit of the present invention using a synchronous RS-FF circuit as the entry management flag circuit. In this case, the configurations of the write entry management circuit 10, the data entry register 11 (11a to 11d), the read entry management circuit 13, the output selector 16, and the voltage level converting circuit 17 (17a to 17f) are the same as the case described above where the asynchronous RS-FF circuit is used. Only the differences will be described below.

Figure 19:
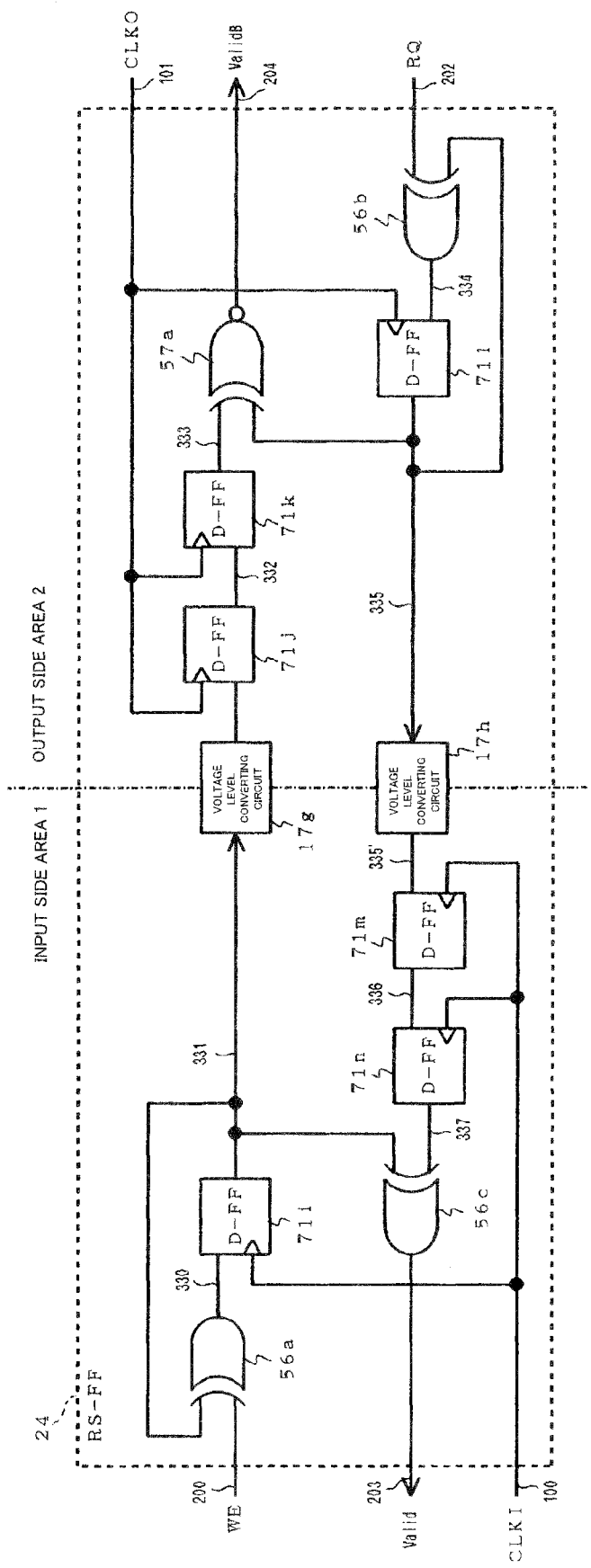
FIG. 19 is a drawing showing a configuration example of an entry management flag circuit of an FIFO buffer circuit according to a fourth example of the present invention.

FIG. 19 is a drawing showing a configuration example of an entry management flag circuit (the entry management flag circuits 12a to 12d shown in FIG. 2) of an FIFO buffer circuit according to a fourth example of the present invention. The configuration of the FIFO buffer circuit according to the fourth example of the present invention is the same as that of the mode of the present invention shown in FIGS. 1 and 2, and the fourth example of the present invention will be described with reference to FIGS. 1 and 2.

In FIG. 19, the entry management flag circuit uses a synchronous RS-FF circuit 24. The left half of FIG. 19 shows the input side area 1 operating at the input side area clock (CLKI) 100 and the right half shows the output side area 2 operating at the output side area clock (CLKO) 101.

The part of the synchronous RS-FF circuit 24 in the input side area 1 is constituted by XOR (exclusive OR) circuits 56a and 56c, and D-FF circuits 71i, 71m, and 71n. The part in the output side area 2 is constituted by an XOR circuit 56b, an XNOR (exclusive NOR) circuit 57a, and D-FF circuits 71j to 71l. Further, voltage level converting circuits 17g and 17h are provided on the boundary between the part of the synchronous RS-FF circuit 24 in the input side area 1 and the part in the output side area 2.

The entry write signal (WE) 200 is supplied to one of two terminals of the XOR circuit 56a and the output of the XOR circuit 56a is fed back to the other terminal of the XOR circuit 56a via the D-FF circuit 71i. Every time the entry write signal 200 is supplied, an output signal 331 of the D-FF circuit 71i is inverted by this loop mechanism. Further, the output of the D-FF circuit 71i is connected to the XOR circuit 56c, which generates the valid signal 203. Further, the output of the D-FF circuit 71i is synchronized via the voltage level converting circuit 17g and the two D-FF circuits 71j and 71k in the output side area 2 and is connected to the XNOR circuit 57a. The XNOR circuit 57a generates an inverted signal 204 obtained by inverting a valid signal.

The entry read signal (RQ) 202 is supplied to the XOR circuit 56b and its output is fed back to the other terminal of the XOR circuit 56b via the D-FF circuit 71l. Every time the entry read signal 202 becomes valid, an output signal 335 of the D-FF circuit 71l is inverted by this loop mechanism. The output of the D-FF circuit 71l, connected to the XNOR circuit 57a, is also transmitted to the input side area 1 via the voltage level converting circuit 17h, synchronized by the two D-FF circuits 71m and 71n, and is connected to the XOR circuit 56c. As a result, the valid signal 203 is cancelled. This synchronous RS-FF loop is constituted by the D-FF circuit 71i, the voltage level converting circuit 17g, the D-FF circuits 71j and 71k, the XNOR circuit 57a, the D-FF circuit 71l, the voltage level converting circuit 17h, the D-FF circuit 71m and 71n, and the XOR circuit 56c, and a part of it operates at the power supply voltage of the input side area 1 while the remaining part operates at the power supply voltage of the output side area 2. It does not form a complete loop as a circuit, however, it forms a pseudo-loop, passing the information through the XOR circuits and the XNOR circuit.

Figure 20:
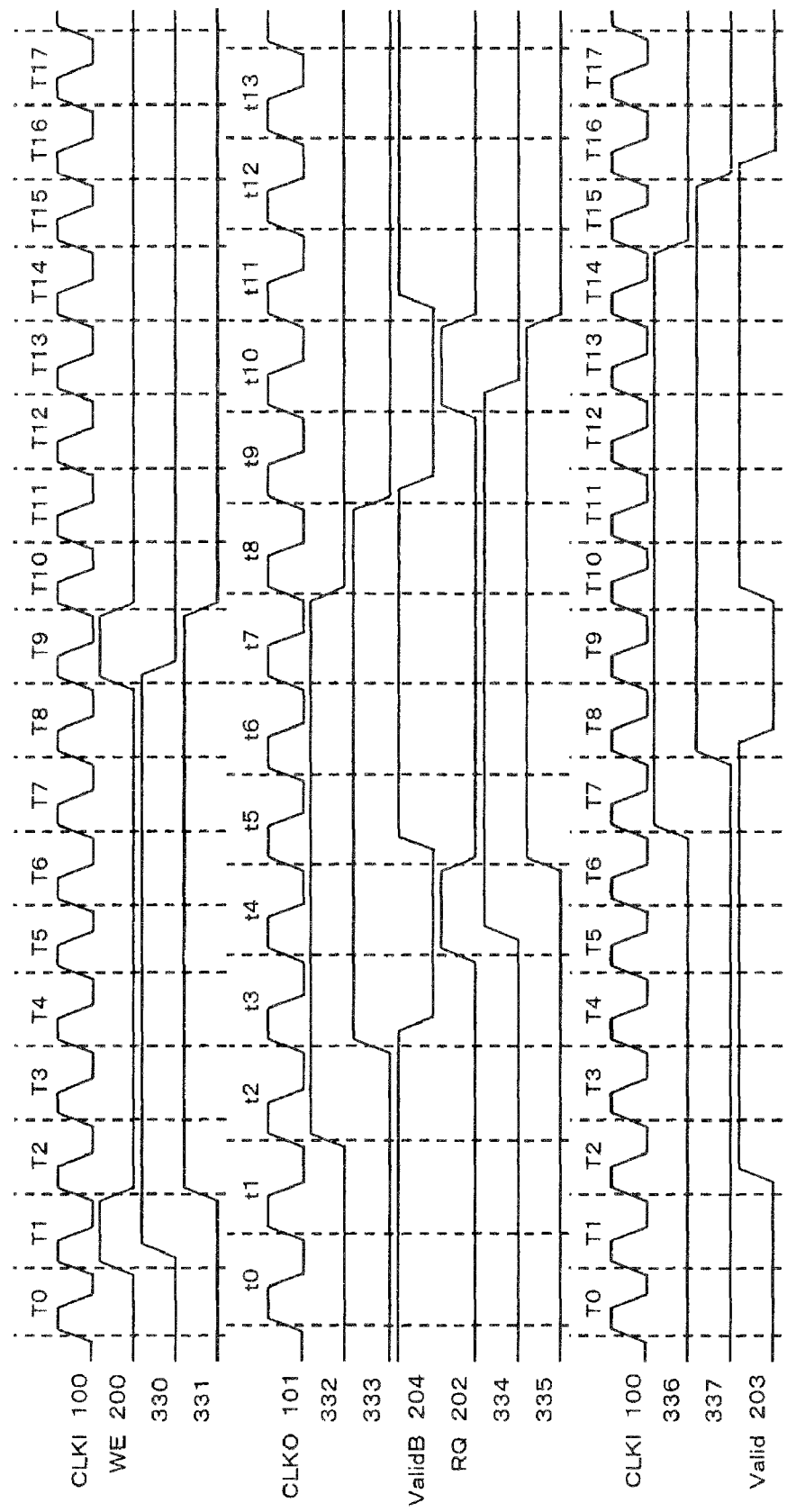
FIG. 20 is a timing chart for explaining the operation of the synchronous RS-FF circuit shown in FIG. 19.

FIG. 20 is a timing chart for explaining the operation of the synchronous RS-FF circuit 24 shown in FIG. 19. The operation of the synchronous RS-FF circuit 24 will be described with reference to FIGS. 19 and 20.

When the entry write signal 200 becomes valid at the timing T1, the output signal 331 of the D-FF circuit 71i is inverted and becomes high level at the timing T2. Further, the valid signal 203 is set. When the signal reaches the output side area 2 via the voltage level converting circuit 17g, after going through the two D-FF circuits 71j and 71k, the output signal 333 is inverted and becomes high level at the timing t3. Then the inverted signal 204 of the valid signal falls.

Next, when the entry read signal (RQ) 202 becomes valid at the timing t4, the output signal 335 of the D-FF circuit 71l is inverted and becomes high level at the timing t5. As a result, the inverted signal 204 of the valid signal falls at the timing t5. Meanwhile the outputs signal 335 reaches the input side area 1 via the voltage level converting circuit 17h, and an output signal 337 of the D-FF circuits 71m and 71n is inverted and becomes high level at the timing T8. Then, the valid signal 203 is reset.

Further, when the entry write signal 200 becomes valid again, the output signal 331 of the D-FF circuit 71i is inverted at timing T10 and becomes low level this time. The valid signal 203 is set. The output signal 331 reaches the output side area 2 and the inverted signal 204 of the valid signal becomes low level at timing t9. When the entry read signal 202 becomes valid at timing t10, the output signal 335 of the D-FF circuit 71k is inverted at timing t11 and becomes low level. The inverted signal 204 of the valid signal rises up. The output signal 335 reaches the input side area 1, the output signal 337 of the D-FF circuit 71n is inverted at timing T16 and becomes low level, and the valid signal 203 is reset.

Figure 21:
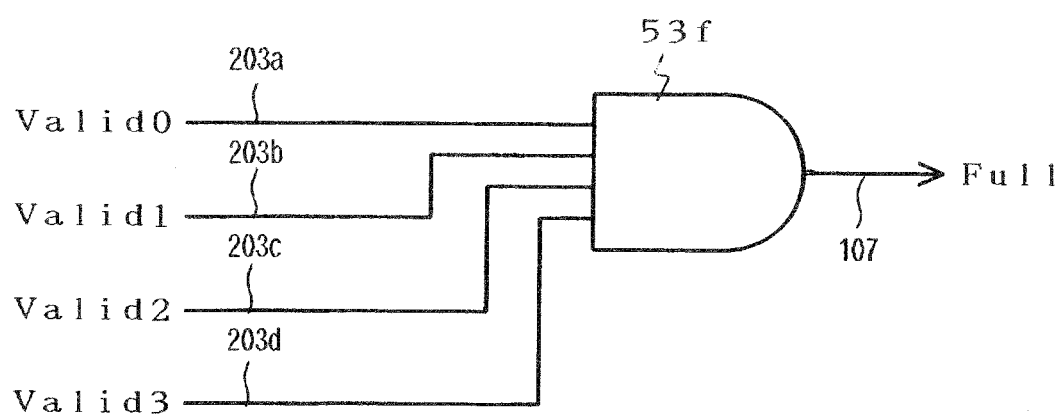
FIG. 21 is a drawing showing a configuration example of a full signal generating circuit of the FIFO buffer circuit according to the fourth example of the present invention.

FIG. 21 is a drawing showing a configuration example of a full signal generating circuit (the full signal generating circuit 14 shown in FIG. 2) of the FIFO buffer circuit according to the fourth example of the present invention. Referring to FIG. 21, since the present example uses the synchronous RS-FF circuit and the clock is synchronized within the entry management flag circuit, the full signal generating circuit does not need a synchronization mechanism and can be constituted merely by a simple AND circuit 53f.

The full signal generating circuit receives the valid signals (Valid 0 to Valid 3) 203a to 203d from the entry management flag circuit, has the AND circuit 53f to perform an AND operation of these signals, and outputs the result as the full signal 107.

Figure 22:
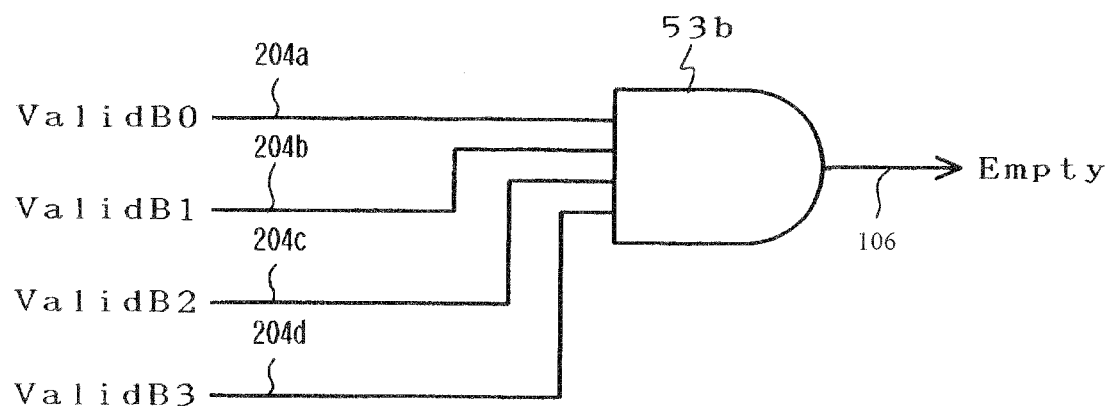
FIG. 22 is a drawing showing a configuration example of an empty signal generating circuit of the FIFO buffer circuit according to the fourth example of the present invention.

FIG. 22 is a drawing showing a configuration example of an empty signal generating circuit (the empty signal generating circuit 15 shown in FIG. 2) of the FIFO buffer circuit according to the fourth example of the present invention. Referring to FIG. 22, since the present example uses the synchronous RS-FF circuit and the clock is synchronized within the entry management flag circuit, the empty signal generating circuit does not need a synchronization mechanism and can be constituted by a simple AND circuit 53b, as in the case of the full signal generating circuit.

The empty signal generating circuit receives the inverted signals (ValidB0 to ValidB3) 204a to 204d of the valid signals from the entry management flag circuit, has the AND circuit 53b to perform an AND operation of these signals, and outputs the result as the empty signal 106.

Figure 23:
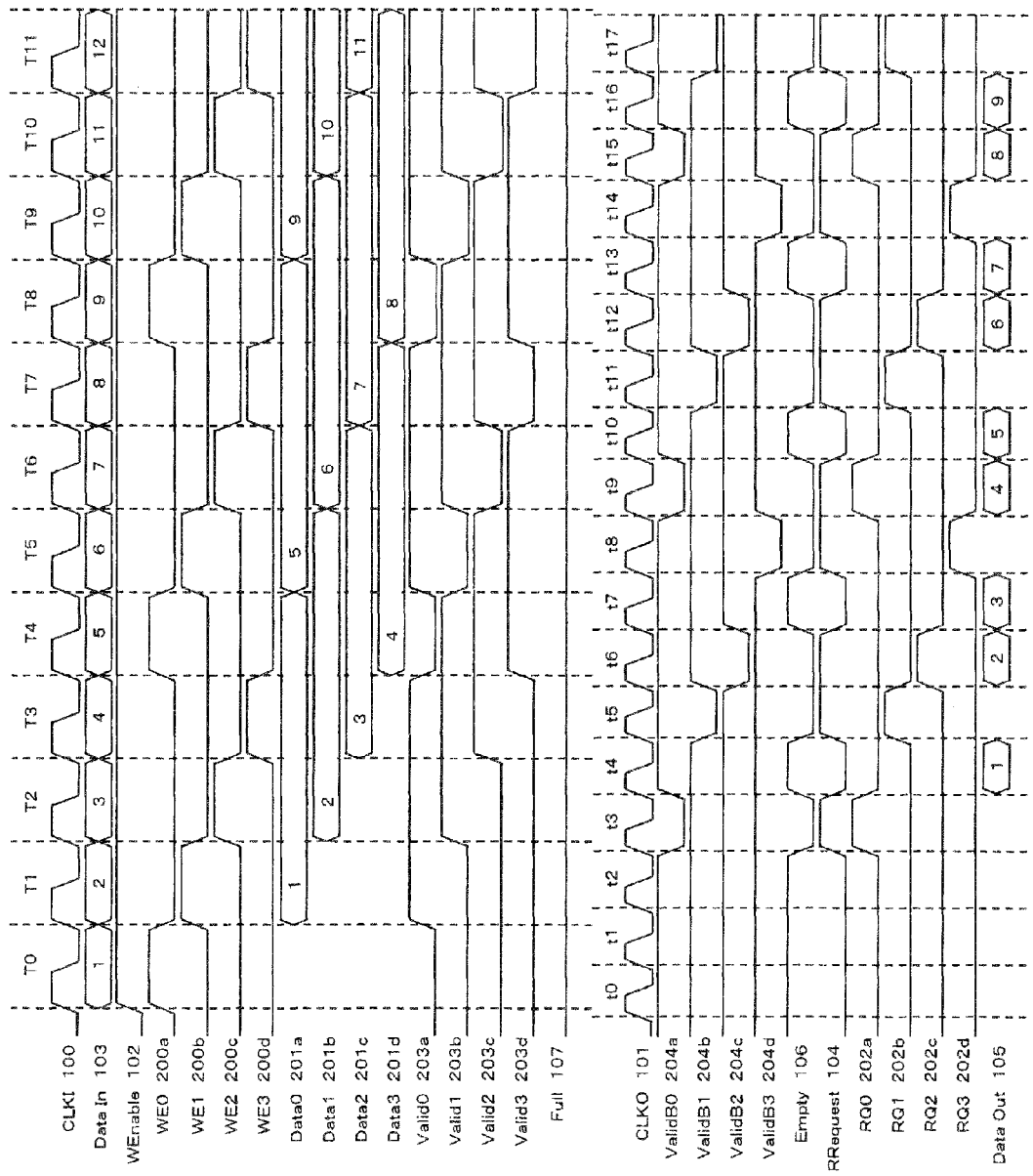
FIG. 23 is a timing chart showing an operation example of the FIFO buffer circuit according to the fourth example of the present invention.
Figure 24:
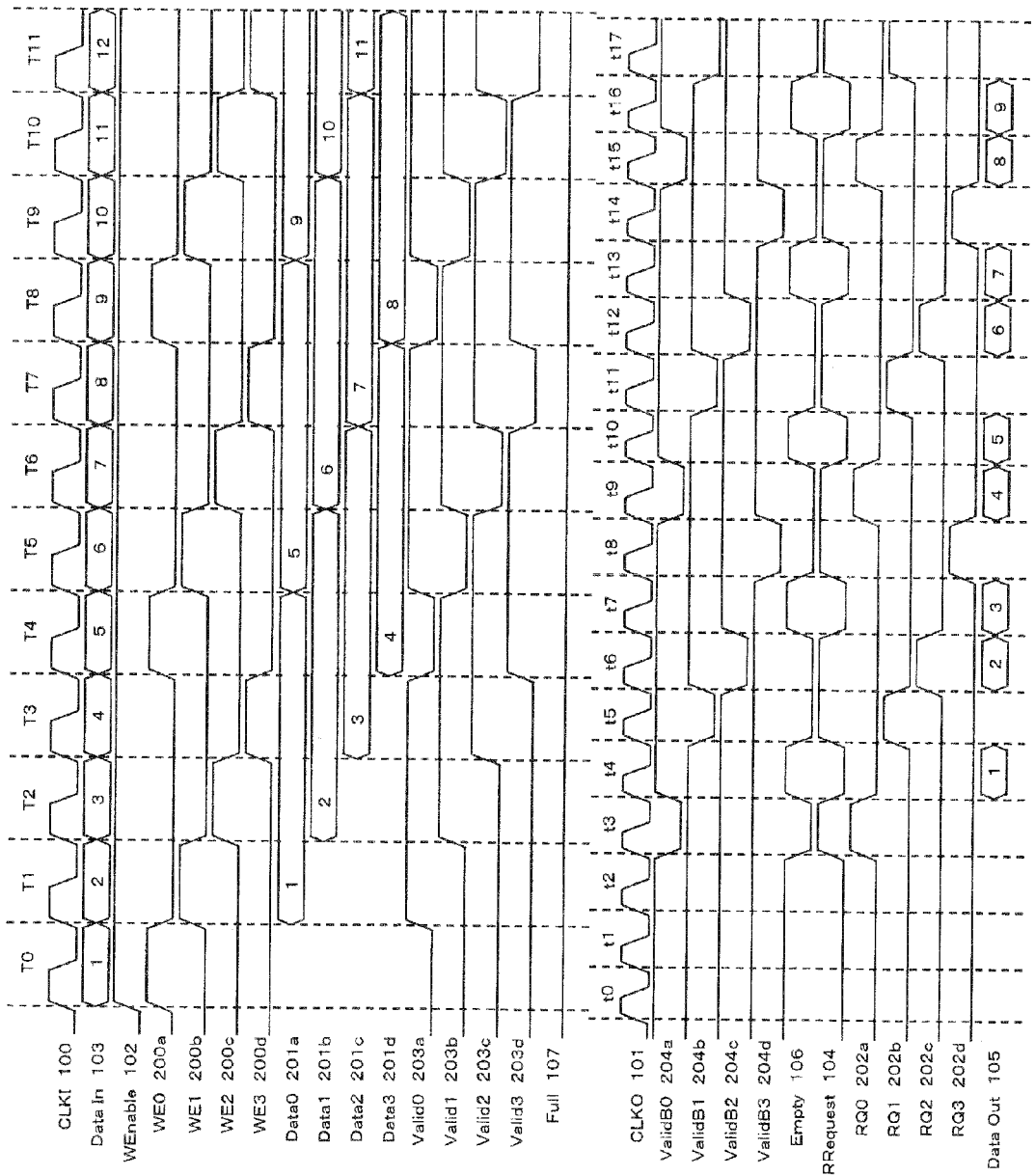
FIG. 24 is a timing chart showing an operation example of the FIFO buffer circuit according to the fourth example of the present invention.
Figure 25:
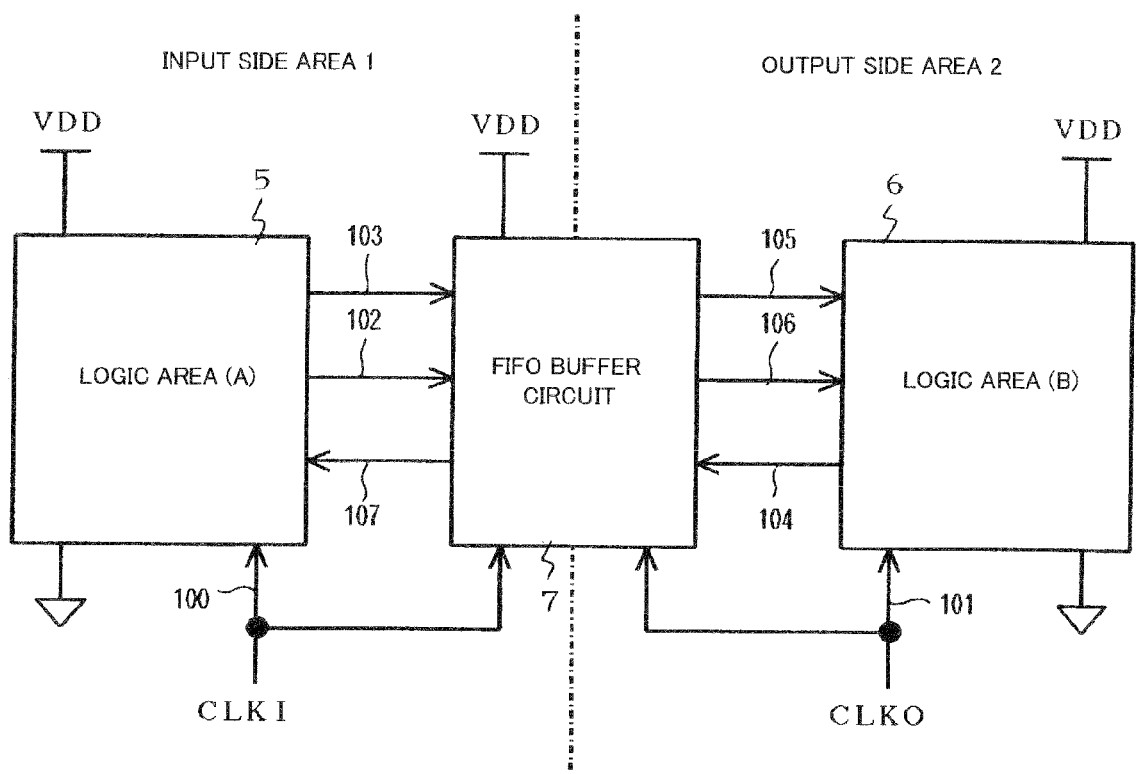
FIG. 25 is a drawing for explaining a conventional FIFO buffer circuit.
Figure 26:
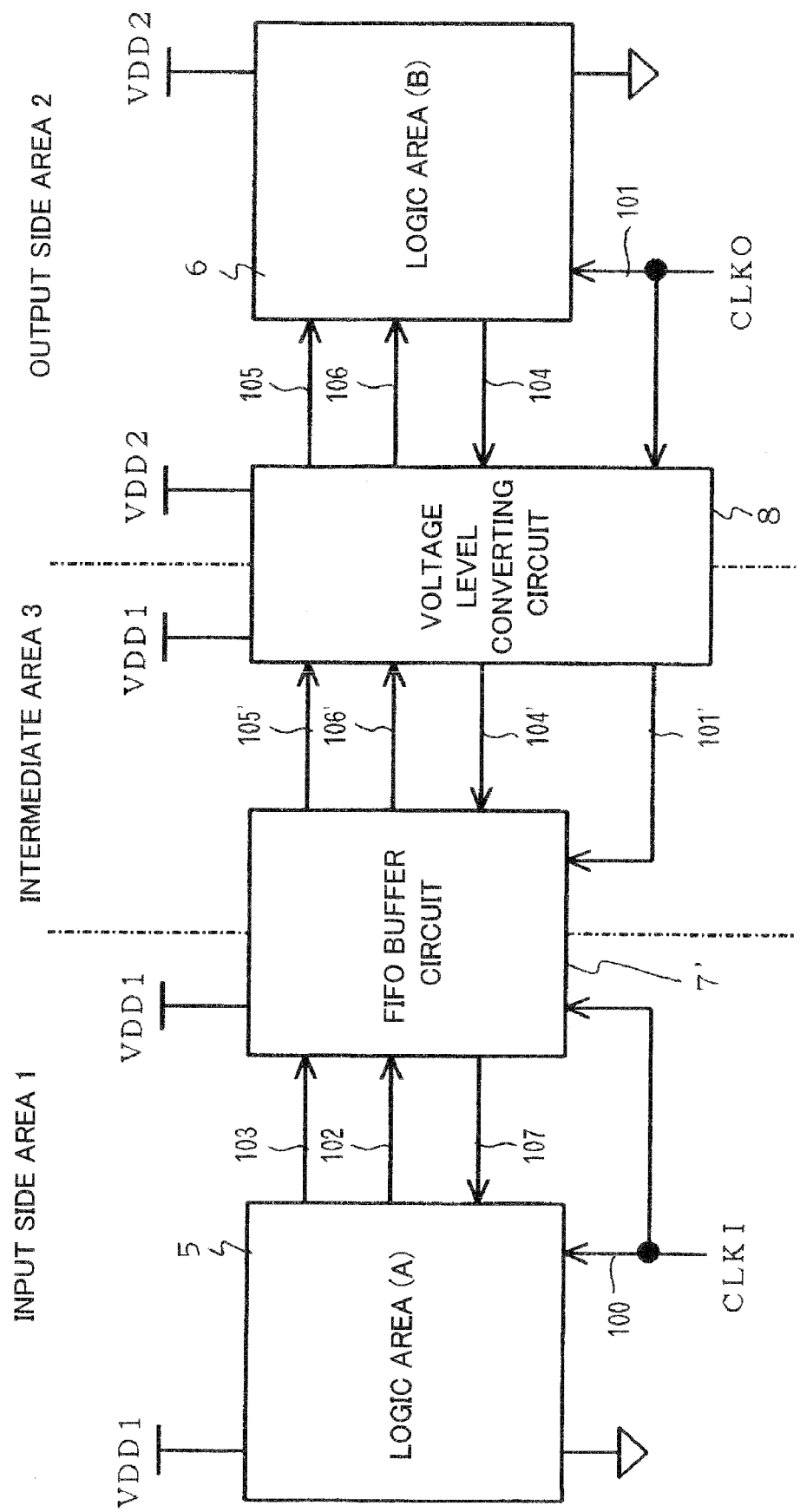
FIG. 26 is a drawing for explaining a method using the conventional FIFO buffer circuit in which data transfer is performed between areas operating at different power supply voltages.
Figure 27:
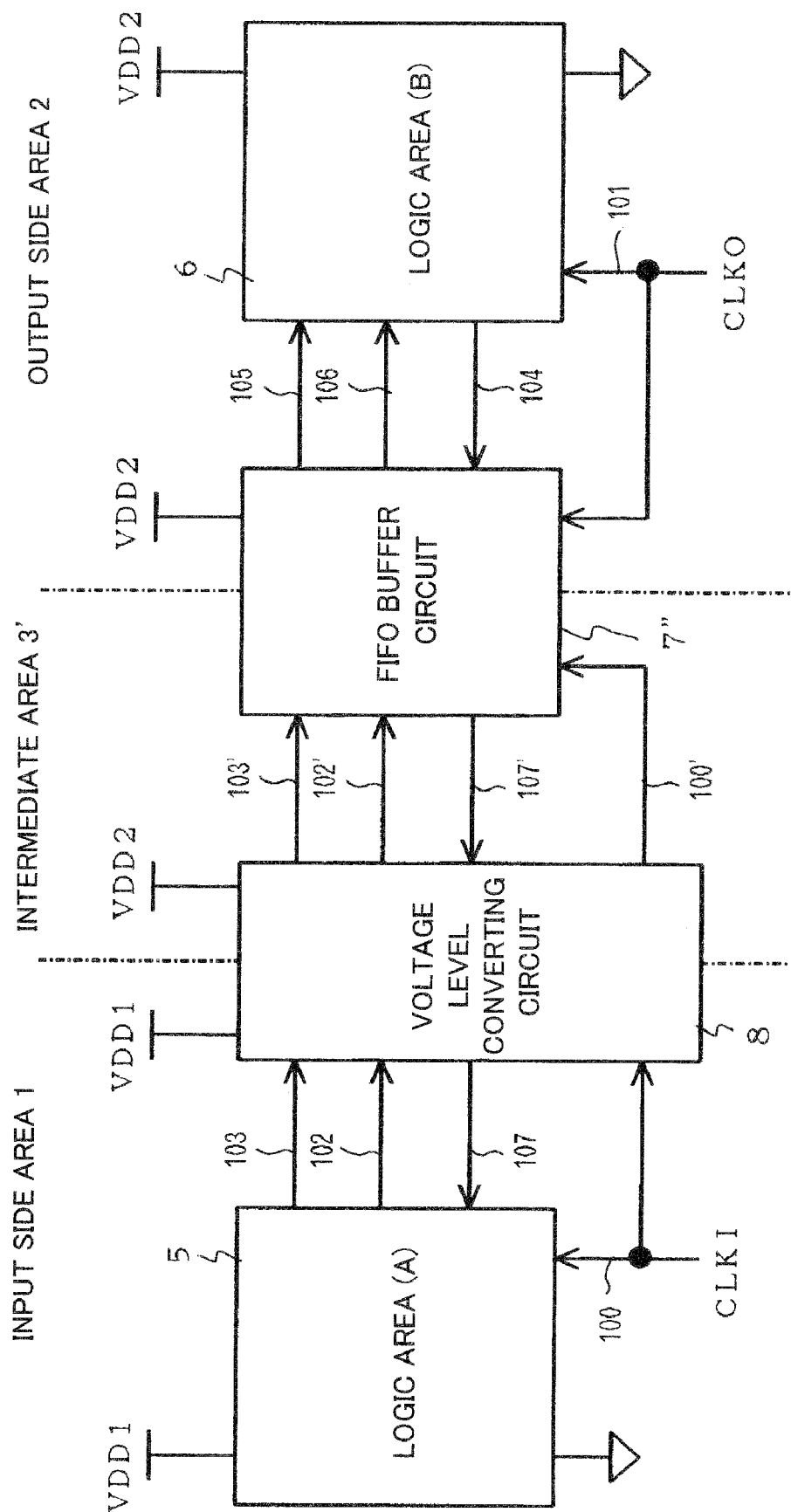
FIG. 27 is a drawing for explaining another method in which data transfer is performed between areas operating at different power supply voltages in the conventional FIFO buffer circuit.

FIGS. 23 and 24 are timing charts showing operation examples of the FIFO buffer circuit according to the fourth example of the present invention. The operation of the FIFO buffer circuit according to the fourth example will be described with reference to FIGS. 19 to 24. FIG. 23 shows an example in which the cycle (period) of the input side area clock 100 is longer than that of the output side area clock 101.

When the write enable signal 102 becomes valid at the timing T0 and the data 1 are about to be registered to the FIFO buffer circuit, the data 1 are registered to the data entry register (#0) 11a and appear at the output terminal 201a at the timing T1. Further, the entry management flag circuit (#0) 12a is set and the valid signal 203a is set. Then the inverted signal 204a of the valid signal falls at the timing t3 and the empty signal 106 is cancelled.

Meanwhile, when the empty signal 106 is cancelled in the logic circuit on the output side and the read request signal 104 becomes valid to read the data, the data 1 are obtained from the data output 105 at the next timing t4. After the timing T1, the data 2, 3, and 4 are registered to the data entry registers (#1) 11b, (#2) 11c, and (#3) 11d respectively.

Since the inverted signal 204b of the valid signal of the entry management flag circuit (#1) 12b falls at the timing t5, the empty signal 106 temporarily becomes valid at the timing t4 and becomes invalid again at the timing t5. Then, when the read request signal 104 becomes valid, the data 2 can be read at the next timing t6. Further, since the inverted signal 204c of the valid signal of the entry management flag circuit (#2) 12c falls at the timing t6, the empty signal 106 continues to be invalid and the data 3 can be read at the timing t7.

In the operation shown in FIG. 23, since the clock cycle of the input side is longer than that of the output side, the entries of the FIFO buffer circuit never gets full and the full signal 107 is always invalid during this operation. As a result, data can be written consecutively. On the output side, data can be read by supplying the read request signal 104 while the empty signal 106 is invalid.

FIG. 24 shows an example in which the cycle of the input side area clock 100 is shorter than that of the output side area clock 101.

When the write enable signal 102 becomes valid at the timing T0 and the data 1 are written to the FIFO buffer circuit, the data 1 are registered to the data entry register (#0) 11a and appear at the output terminal 201a at the timing T1. At the same time, the valid signal 203a is set. In the output side area 2, the inverted signal 204a of the valid signal falls at the timing t2 and then the empty signal 106 becomes invalid. If the read request signal 104 is supplied in this state, the data 1 can be obtained from the data output 105 at the next timing t3.

If the data 2, 3, and 4 are written consecutively at the timings T2, T3, and T4, these data will be sequentially registered to the data entry registers (#1) 11b, (#2) 11c, and (#3) 11d. The corresponding entry management flag circuits (#1) 12b, (#2) 12c, and (#3) 12d are respectively set and the valid signals 203b, 203c, and 203d become high level.

In the example shown in FIG. 24, since the read operation is slow, when this much data have been registered, the entries get full and the full signal 107 becomes valid. Here, the write operation is suspended. Since the first data 1 are read at timing T6, an empty entry is created and the full signal 107 is cancelled, resuming the write operation. Since the clock cycle on the output side is longer than that on the input side, the data can be read continuously during this operation once the empty signal 106 becomes invalid at the timing t2.

Generally, the RS-FF circuit uses a bistable circuit in a loop. When the RS-FF circuit is applied to the entry management of the FIFO buffer circuit, a part of the loop is in a circuit area operating at the clock of the input side and the remaining part is in a circuit area operating at the clock of the output side area since the set operation is performed from the circuits in the input side area 1 and the reset operation is performed from the circuits in the output side area 2. Further, the set terminal of the RS-FF circuit belongs to the input side area 1 and the reset terminal of the RS-FF circuit belongs to the output side area 2 because of this configuration.

The boundary between areas operating at different power supply voltages can be positioned at the same place as the boundary between areas operating at different clocks by inserting the voltage level converting circuits in this loop. In the examples described above, only an example of the asynchronous RS-FF circuit or the synchronous RS-FF circuit is described, however, it is possible to position the boundary between areas operating at different power supply voltages at the same place as the boundary between areas operating at different clocks by using other configurations of the RS-FF circuit and inserting the voltage level converting circuits so as to divide the loop into two.

The invention claimed is:

1. A semiconductor digital circuit performing data transfer between first and second circuit areas operating at different power supply voltages and different operation clocks, wherein the semiconductor digital circuit is disposed on a boundary between said first and second circuit areas, and the circuit includes circuit elements that perform interconversions between different signal voltage levels of said first and second circuit areas, the semiconductor digital circuit comprising:

a plurality of data entry registers that hold data;

entry management flag circuits that manage the presence or absence of effective data in each of said plurality of said data entry registers;

a write entry management circuit that specifies an entry to which data are written out of said data entry registers;

a read entry management circuit that specifies an entry from which data are read out of said data entry registers;

an output selector that selects one of contents in the data entry registers according to an instruction from said read entry management circuit and outputs the selected content; and voltage level converting circuits that mutually convert signal voltage levels of each of said first and second circuit areas; and wherein said voltage level converting circuits are respectively provided between outputs of said data entry registers and inputs of said output selector, and inside said entry management flag circuits.

2. The semiconductor digital circuit as defined in claim 1, wherein said plurality of data entry registers comprise M number (where M is a positive integer) of data entry registers that hold N bit data (where N is a positive integer); and the semiconductor digital circuit further comprises entry management flag circuits for M entries, where M is a positive integer, that manage the presence or absence of effective data in each of said data entry registers; a full signal generating circuit that generates a full signal indicating that said data entry registers are full from respective outputs of said entry management flag circuit; and an empty signal generating circuit that generates an empty signal indicating that there is no effective data in said data entry registers from each output of said entry management flag circuit.

3. The semiconductor digital circuit as defined in claim 2 wherein all of said data entry registers, said write entry management circuit, and said full signal generating circuit, and a portion of said entry management flag circuits are defined as a first circuit area operating at a first power supply voltage and a first clock; and all of said read entry management circuit, said empty signal generating circuit, and said output selector, and the remainder of said entry management flag circuits are defined as a second circuit area operating at a second power supply voltage and a second clock.

4. The semiconductor digital circuit as defined in claim 3 wherein said entry management flag circuits are constituted by either of asynchronous RS-Flip-Flop circuits or synchronous RS-Flip-Flop circuits and said voltage level converting circuits are provided at two locations in loops in said RS-Flip-Flop circuits.

5. The semiconductor digital circuit as defined in claim 3 wherein said entry management flag circuits are constituted by asynchronous RS-Flip-Flop circuits comprised of two NOR circuits, and said voltage level conversions are performed simultaneously by constituting said NOR circuits with Cascade Voltage Switch Logic, CVSL circuits.

6. The semiconductor digital circuit as defined in claim 5 wherein said entry management flag circuits are constituted by asynchronous RS-Flip-Flop circuits, receive an entry write signal from said write entry management circuit at a set terminal, and receive an entry read signal from said read entry management circuit at a reset terminal.

7. The semiconductor digital circuit as defined in claim 6 wherein the boundary between said first circuit area and said second circuit area is defined so as to divide two locations in a loop in said asynchronous RS-Flip-Flop circuit.

8. The semiconductor digital circuit as defined in claim 7 wherein said voltage level converting circuit is disposed on the boundary between said first circuit area and said second circuit area of the loop in said asynchronous RS-Flip-Flop circuit.

9. The semiconductor digital circuit as defined in claim 8 wherein said voltage level conversion is performed by constituting said asynchronous RS-Flip-Flop circuit with two NOR circuits and constituting said NOR circuits with Cascade Voltage Switch Logic, CVSL circuits.

10. The semiconductor digital circuit as defined in claim 7 wherein the set terminal of said asynchronous RS-Flip-Flop circuit is disposed in said first circuit area and the reset terminal is disposed in said second circuit area.

11. The semiconductor digital circuit as defined in claim 3 wherein said voltage level conversion is performed by constituting said output selector with a Cascade Voltage Switch Logic, CVSL circuit.

12. The semiconductor digital circuit as defined in claim 3 wherein said entry management flag circuits are constituted by synchronous RS-Flip-Flop circuits, receive an entry write signal from said write entry management circuit at a set terminal, and receive an entry read signal from said read entry management circuit at a reset terminal.

13. The semiconductor digital circuit as defined in claim 12 wherein the boundary between said first circuit area and said second circuit area is defined so as to divide two locations in a loop in said synchronous RS-Flip-Flop circuit constituting said entry management flag circuit.

14. The semiconductor digital circuit as defined in claim 13 wherein said voltage level converting circuit is disposed on the boundary between said first circuit area and said second circuit area of the loop in said synchronous RS-Flip-Flop circuit.

15. The semiconductor digital circuit as defined in claim 12 wherein the set terminal of said synchronous RS-Flip-Flop circuit is disposed in said first circuit area, and the reset terminal is disposed in said second circuit area.

16. A data transferring method, used in a semiconductor digital circuit that performs data transfer between first and second circuit areas operating at different power supply voltages and different operation clocks, the method comprising:
preparing the semiconductor digital circuit, disposed on a boundary between said first and second circuit areas, that performs data transfer; and
performing interconversions between different signal voltage levels of said first and second circuit areas within the semiconductor digital circuit, wherein
the semiconductor digital circuit is constituted by a plurality of data entry registers that hold data; entry management flag circuits that manage the presence or absence of effective data in each of said plurality of said data entry registers; a write entry management circuit that specifies an entry to which data are written out of said data entry registers; a read entry management circuit that specifies an entry from which data are read out of said data entry registers; an output selector that selects one of contents in the data entry registers according to an instruction from said read entry management circuit and outputs the selected content; and voltage level converting circuits that mutually convert signal voltage levels of each of said first and second circuit areas; and
said voltage level converting circuits are respectively provided between outputs of said data entry registers and inputs of said output selector, and inside said entry management flag circuits.

17. The data transferring method as defined in claim 16 wherein said plurality of said data entry registers includes data entry registers, M in number where M is a positive integer, that hold N-bit data where N is a positive integer; and the semiconductor digital circuit further comprises:
entry management flag circuits for M entries that manage the presence or absence of effective data in each of said data entry registers;
a full signal generating circuit that generates a full signal indicating that said data entry registers are full from respective outputs of said entry management flag circuit; and
an empty signal generating circuit that generates an empty signal indicating that there is no effective data in said data entry registers from each output of said entry management flag circuit.

18. The data transferring method as defined in claim 17 wherein all of said data entry registers, said write entry management circuit, and said full signal generating circuit, and portion of said entry management flag circuits are defined as a first circuit area operating at a first power supply voltage and a first clock; and all of said read entry management circuit, said empty signal generating circuit, and said output selector, and the remainder of said entry management flag circuits are defined as a second circuit area operating at a second power supply voltage and a second clock.

19. The data transferring method as defined in claim 18 wherein said entry management flag circuits are constituted by either of asynchronous RS-Flip-Flop circuits or synchronous RS-Flip-Flop circuits and said voltage level converting circuits are provided at two locations in loops in said RS-Flip-Flop circuits.

20. The data transferring method as defined in claim 18 wherein said entry management flag circuits are constituted by asynchronous RS-Flip-Flop circuits comprised of two NOR circuits, and said voltage level conversions are performed simultaneously by constituting said NOR circuits with Cascade Voltage Switch Logic, CVSL circuits.

21. The data transferring method as defined in claim 20 wherein said entry management flag circuits are constituted by asynchronous RS-Flip-Flop circuits, receive an entry write signal from said write entry management circuit at a set terminal, and receive an entry read signal from said read entry management circuit at a reset terminal.

22. The data transferring method as defined in claim 21 wherein the boundary between said first circuit area and said second circuit area is defined so as to divide two locations in a loop in said asynchronous RS-Flip-Flop circuit.

23. The data transferring method as defined in claim 22 wherein said voltage level converting circuit is disposed on the boundary between said first circuit area and said second circuit area of the loop in said asynchronous RS-Flip-Flop circuit.

24. The data transferring method as defined in claim 23 wherein said voltage level conversion is performed by constituting said asynchronous RS-Flip-Flop circuit with two NOR circuits and constituting said NOR circuits with Cascade Voltage Switch Logic, CVSL circuits.

25. The data transferring method as defined in claim 22 wherein the set terminal of said asynchronous RS-Flip-Flop circuit is disposed in said first circuit area and the reset terminal is disposed in said second circuit area.

26. The data transferring method as defined in claim 18 wherein said voltage level conversion is performed by constituting said output selector with a Cascade Voltage Switch Logic, CVSL circuit.

27. The data transferring method as defined in claim 18 wherein said entry management flag circuits are constituted by synchronous RS-Flip-Flop circuits, receive an entry write signal from said write entry management circuit at a set terminal, and receive an entry read signal from said read entry management circuit at a reset terminal.

28. The data transferring method as defined in claim 27 wherein the boundary between said first circuit area and said second circuit area is defined so as to divide two locations in a loop in said synchronous RS-Flip-Flop circuit constituting said entry management flag circuit.

29. The data transferring method as defined in claim 28 wherein said voltage level converting circuit is disposed on the boundary between said first circuit area and said second circuit area of the loop in said synchronous RS-Flip-Flop circuit.

30. The data transferring method as defined in claim 27 wherein the set terminal of said synchronous RS-Flip-Flop circuit is disposed in said first circuit area and the reset terminal is disposed in said second circuit area.

* * * * *